United States Patent
He et al.

(10) Patent No.: US 11,575,094 B2
(45) Date of Patent: Feb. 7, 2023

(54) LIGHT-MODULATED, PEROVSKITE-BASED, ENERGY CONVERTING DEVICE

(71) Applicant: KING ABDULLAH UNIVERSITY OF SCIENCE AND TECHNOLOGY, Thuwal (SA)

(72) Inventors: Jr-Hau He, Thuwal (SA); Tzu-Chiao Wei, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 936 days.

(21) Appl. No.: 16/415,312

(22) Filed: May 17, 2019

(65) Prior Publication Data

US 2019/0378999 A1 Dec. 12, 2019

Related U.S. Application Data

(60) Provisional application No. 62/681,778, filed on Jun. 7, 2018.

(51) Int. Cl.
| | |
|---|---|
| *H01L 51/42* | (2006.01) |
| *H01L 31/0392* | (2006.01) |
| *H01L 41/107* | (2006.01) |
| *H01L 41/113* | (2006.01) |

(52) U.S. Cl.
CPC ...... *H01L 51/4206* (2013.01); *H01L 31/0392* (2013.01); *H01L 41/107* (2013.01); *H01L 41/113* (2013.01)

(58) Field of Classification Search
CPC . H01L 41/107; H01L 41/113; H01L 31/0392; H01L 51/4206

USPC .......................................................... 310/311
See application file for complete search history.

(56) References Cited

U.S. PATENT DOCUMENTS 10,214,833 B1 * 2/2019 Kaehr .................... B33Y 10/00

OTHER PUBLICATIONS

Mosconi, E., et al., "First-Principles Modeling of Mixed Halide Organometal Perovskites for Photovoltaic Applications," The Journal of Physical Chemistry C, vol. 117, Issue 27, Jul. 11, 2013 (Published on the Web Jun. 13, 2013), pp. 13902-13913.
Neukirch, A.J., et al., "Polaron Stabilization by Cooperative Lattice Distortion and Cation Rotations in Hybrid Perovskite Materials," Nano Letters, vol. 16, No. 6, 2016 (Published on the Web May 25, 2016), pp. 3809-3816.
Noh, J.H., et al., "Chemical Management for Colorful, Efficient, and Stable Inorganic—Organic Hybrid Nanostructured Solar Cells," Nano Letters, vol. 13, No. 4, 2013 (Published on the Web Mar. 21, 2013), pp. 1764-1769.

(Continued)

*Primary Examiner* — Shawki S Ismail
*Assistant Examiner* — Monica Mata
(74) *Attorney, Agent, or Firm* — Patent Portfolio Builders PLLC

(57) ABSTRACT

An energy converting device includes a base, which is fixed; a methylammonium lead bromide (MAPbBr$_3$) material having a first end fixedly attached to the base and a second end free to move; and an actuator block attached to the second end of the MAPbBr$_3$ material. The actuator block moves relative to the base when the MAPbBr$_3$ material is exposed to light.

17 Claims, 17 Drawing Sheets

(56) References Cited

OTHER PUBLICATIONS

Onoda-Yamamuro, N., et al., "Dielectric Study of $CH_3NH_3PbX_3$, (X = Cl, Br, I)," J. Phys. Chem. Solids, vol. 53, No. 7, Jul. 1992, pp. 935-939.

Park, J.-S., et al., "Electronic Structure and Optical Properties of α-CH3NH3PbBr3 Perovskite Single Crystal," The Journal of Physical Chemistry Letters, vol. 6, No. 21, 2015 (Published on the Web Oct. 13, 2015), pp. 4304-4308.

Park, N.-G., "Organometal Perovskite Light Absorbers Toward a 20% Efficiency Low-Cost Solid-State Mesoscopic Solar Cell," The Journal of Physical Chemistry Letters, vol. 4, Issue 15, Aug. 1, 2013 (Published on the Web Jul. 11, 2013), pp. 2423-2429.

Park, N.-G., et al. (Editors), "Organic-Inorganic Halide Perovskite Photovoltaics: From Fundamentals to Device Architectures," Springer Nature, Springer International Publishing AG, Switzerland, 2016, 366 pages.

Peng, C.-Y., et al., "Comprehensive study of the Raman shifts of strained silicon and germanium," Journal of Applied Physics, vol. 105, No. 8, May 2009 (Published online Apr. 27, 2009), pp. 083537-1-083537-10 (11 pages total).

Peng, C.-Y., et al., "Effects of Applied Mechanical Uniaxial and Biaxial Tensile Strain on the Flatband Voltage of (001), (110), and (111) Metal-Oxide-Silicon Capacitors," IEEE Transactions on Electron Devices, vol. 56, No. 8, Aug. 2009 (First Published Jun. 23, 2009; Current Version Published Jul. 22, 2009), pp. 1736-1745.

Poglitsch, A., et al., "Dynamic disorder in methylammoniumtrihalogenoplumbates (II) observed by millimeter-wave spectroscopy," The Journal of Chemical Physics, vol. 87, No. 11, Dec. 1, 1987, pp. 6373-6378 (7 pages total).

Poosanaas, P., et al., "Influence of sample thickness on the performance of photostrictive ceramics," Journal of Applied Physics, vol. 84, No. 3, Aug. 1, 1998, pp. 1508-1512 (6 pages total).

Rakita, Y., et al., "Mechanical Properties of $APbX_3$ (A=Cs or $CH_3NH_3$; X=I or Br) Perovskite Single Crystals," MRS Communications, vol. 5, Dec. 2015 (Published online Oct. 6, 2015), pp. 623-629 (20 pages provided).

Sadhanala, A., et al., "Preparation of Single-Phase Films of $CH_3NH_3Pb(I_{1-x}Br_x)_3$ with Sharp Optical Band Edges," The Journal of Physical Chemistry Letters, vol. 5, No. 15, 2014 (Published on the Web Jul. 9, 2014), pp. 2501-2505.

Saidaminov, M.I., et al., "High-quality bulk hybrid perovskite single crystals within minutes by inverse temperature crystallization," Nature Communications, vol. 6, Article 7586, Jul. 6, 2015, pp. 1-6.

Schick, D., et al., "Localized Excited Charge Carriers Generate Ultrafast Inhomogeneous Strain in the Multiferroic $BiFeO_3$," Physical Review Letters, vol. 112, Mar. 3, 2014, pp. 097602-1-097602-6.

Sendner, M., et al., "Optical phonons in methylammonium lead halide perovskites and implications for charge transport," Materials Horizons, vol. 3, 2016 (Open Access Article—Published Oct. 7, 2016), pp. 613-620.

Shi, D., et al., "Low trap-state density and long carrier diffusion in organolead trihalide perovskite single crystals," Science, vol. 347, Issue 6221, Jan. 30, 2015, pp. 519-522 (5 pages total).

Shih, H.Y., et al., "Size-dependent photoelastic effect in ZnO nanorods," Applied Physics Letters, vol. 94, Issue 2, 2009 (Published online Jan. 15, 2009), pp. 021908-1-021908-3 (4 pages total).

Snaith, H.J., "Perovskites: The Emergence of a New Era for Low-Cost, High-Efficiency Solar Cells," The Journal of Physical Chemistry Letters, vol. 4, No. 21, 2013 (Published on the Web Oct. 10, 2013), pp. 3623-3630.

Song, Q., et al., "The In-Plane Anisotropy of $WTe_2$ Investigated by Angle-Dependent and Polarized Raman Spectroscopy," Scientific Reports, vol. 6, Jul. 11, 2016, pp. 1-9.

Sorianello, V., et al., "Thermally evaporated single-crystal Germanium on Silicon," Thin Solid Films, vol. 519, Issue 22, Sep. 1, 2011 (Available online Jun. 16, 2011), pp. 8037-8040.

Takagi, K., et al., "Ferroelectric and Photostrictive Properties of Fine-Grained PI / I Ceramics Derived from Mechanical Alloying," Journal of the American Ceramic Society, vol. 87, No. 8, Aug. 2004, pp. 1477-1482.

Tan, Z.-K., et al., "Bright light-emitting diodes based on organometal halide perovskite," Nature Nanotechnology, vol. 9, Sep. 2014 (Published online Aug. 3, 2014), pp. 687-692.

Tian, W., et al., "Visualizing Carrier Diffusion in Individual Single-Crystal Organolead Halide Perovskite Nanowires and Nanoplates," Journal of the American Chemical Society, vol. 137, No. 39, 2015 (Published on the Web Sep. 21, 2015), pp. 12458-12461.

Van Der Veen, G., et al., "Where Doctors Draw the Line," Nature, vol. 230, Mar. 12, 1971, p. 70.

Venkateshvaran, D., et al., "Approaching disorder-free transport in high-mobility conjugated polymers," Nature, vol. 515, Nov. 20, 2014 (Published online Novembers, 2014), pp. 384 388.

Walters, G., et al., "Two-Photon Absorption in Organometallic Bromide Perovskites," ACS Nano, vol. 9, No. 9, 2015 (Published online Jul. 21, 2015), pp. 9340-9346.

Wang, Y., et al., "Density Functional Studies of Stoichiometric Surfaces of Orthorhombic Hybrid Perovskite $CH_3NH_3PbI_3$," The Journal of Physical Chemistry C, vol. 119, 2015 (Published Dec. 19, 2014), pp. 1136-1145.

Wang, Y., et al., "Pressure-Induced Phase Transformation, Reversible Amorphization, and Anomalous Visible Light Response in Organolead Bromide Perovskite," Journal of the American Chemical Society, vol. 137, No. 34, 2015 (Published on the Web Aug. 18, 2015), pp. 11144-11149.

Wasylishen, R.E., et al., "Cation Rotation in Methylammonium Lead Halides," Solid State Communications, vol. 56, No. 7, Nov. 1985, pp. 581-582.

Wehrenfennig, C., et al., "High Charge Carrier Mobilities and Lifetimes in Organolead Trihalide Perovskites," Advanced Materials, vol. 26, Issue 10, Mar. 12, 2014 (Published online Dec. 20, 2013), pp. 1584-1589.

Yang, W.S., et al., "High-performance photovoltaic perovskite layers fabricated through intramolecular exchange," Science, vol. 348, Issue 6240, Jun. 12, 2015, pp. 1234-1237 (5 pages total).

Yang, Y., et al., "Low surface recombination velocity in solution-grown $CH_3NH_3PbBr_3$ perovskite single crystal," Nature Communications, vol. 6, Article 7961, Aug. 6, 2015, pp. 1-6.

Zheng, X., et al., "The Controlling Mechanism for Potential Loss in $CH_3NH_3PbBr_3$ Hybrid Solar Cells," ACS Energy Letters, vol. 1, No. 2, 2016 (Published on the Web Jul. 25, 2016), pp. 424-430.

Zhou, Y., et al., "Giant photostriction in organic-inorganic lead halide perovskites," Nature Communications, vol. 7, Article 11193, Apr. 5, 2016, pp. 1-8.

Zhu, H., et al., "Lead halide perovskite nanowire lasers with low lasing thresholds and high quality factors," Nature Materials, vol. 14, No. 6, Jun. 2015 (Published online Apr. 13, 2015), pp. 636-642 (8 pages total).

Aharon, S., et al., "Hybrid Lead Halide Iodide and Lead Halide Bromide in Efficient Hole Conductor Free Perovskite Solar Cell," The Journal of Physical Chemistry C, vol. 118, Issue 30, Jul. 31, 2014 (Published on the Web Apr. 17, 2014), pp. 17160-17165.

Ahlawat, A., et al., "Raman tensor and domain structure study of single-crystal-like epitaxial films of $CaCu_3Ti_4O_{12}$ grown by pulsed laser deposition," Journal of Physics: Condensed Matter, vol. 25, No. 2, Jan. 16, 2013 (Published pnline Nov. 29, 2012), pp. 1-6 (7 pages total).

Ahmad, S., et al., "Structural tunability and switchable exciton emission in inorganic-organic hybrids with mixed halides," Journal of Applied Physics, vol. 114, Issue 23, Dec. 21, 2013 (Published online Dec. 20, 2013), pp. 233511-1-233511-8 (9 pages total).

Benavides-Garcia, M., et al., "Bond energies, ionization potentials, and the singlet-triplet energy separations of $SnCl_2$, $SnBr_2$, $SnI_2$, $PbCl_2$, $PbBr_2$, $PbI_2$, and their positive ions," The Journal of Chemical Physics, vol. 100, No. 4, Feb. 15, 1994, pp. 2821-2830 (11 pages total).

Buschert, J.R., et al., "Photostriction Effect In Silicon Observed By Time-Resolved X-Ray Diffraction," Solid State Communications, vol. 80, No. 6, Nov. 1991, pp. 419-422.

(56) References Cited

OTHER PUBLICATIONS

Chen, Q., et al., "Under the spotlight: The organic-inorganic hybrid halide perovskite for optoelectronic applications," Nano Today, vol. 10, Issue 3, Jun. 2015 (Available online Jun. 9, 2015), pp. 355-396.
Chen, T.T., et al., "Photoelastic effect in ZnO nanorods," Nanotechnology, vol. 18, No. 22, Jun. 6, 2007 (Published May 8, 2007), pp. 1-4 (5 pages total).
Cheng, Z., et al., "Layered organic-inorganic hybrid perovskites: structure, optical properties, film preparation, patterning and templating engineering," Cryst. Eng Comm., vol. 12, Jul. 6, 2010, pp. 2646-2662.
Coll, M., et al., "Polarization Switching and Light-Enhanced Piezoelectricity in Lead Halide Perovskites," The Journal of Physical Chemistry Letters, vol. 6, No. 8, Mar. 30, 2015, pp. 1408-1413.
Daranciang, D., et al., "Ultrafast Photovoltaic Response in Ferroelectric Nanolayers," Physical Review Letters, vol. 108, No. 8, Feb. 23, 2012, pp. 087601-1-087601-6.
De Wolf, I., "Micro-Raman spectroscopy to study local mechanical stress in silicon integrated circuits," Semiconductor Science and Technology, vol. 11, Issue 2, Feb. 1996, pp. 139-154 (17 pages total).
Deluca, M., et al., "First-Order Transverse Phonon Deformation Potentials of Tetragonal Perovskites," J. Phys. Chem. A, vol. 112, No. 44, 2008 (Published on the Web Oct. 9, 2008), pp. 11165-11171.
Deschler, F., et al., "High Photoluminescence Efficiency and Optically Pumped Lasing in Solution-Processed Mixed Halide Perovskite Semiconductors," The Journal of Physical Chemistry Letters, vol. 5, No. 8, 2014 (Published on the Web Mar. 24, 2014), pp. 1421-1426.
Dharamsi, A.N., et al., "Characteristics of photostrictively produced optoacoustic pulses," The Journal of the Acoustical Society of America, vol. 95, No. 1, Jan. 1994, pp. 234-243 (11 pages total).
Dou, L., et al., "Solution-processed hybrid perovskite photodetectors with high detectivity," Nature Communications, vol. 5, Nov. 20, 2014, pp. 1-6.
Egger, D.A., et al., "Role of Dispersive Interactions in Determining Structural Properties of Organic-Inorganic Halide Perovskites: Insights from First-Principles Calculations," The Journal of Physical Chemistry Letters, vol. 5, Jul. 22, 2014, pp. 2728-2733.
Even, J., et al., "Molecular disorder and translation/rotation coupling in the plastic crystal phase of hybrid perovskites," Nanoscale, vol. 8, 2016 (Open Access Article—Published Nov. 26, 2015), pp. 6222-6236.
Fang, Y., et al., "Highly narrowband perovskite single-crystal photodetectors enabled by surface-charge recombination," Nature Photonics, vol. 9, Oct. 2015 (Published online Aug. 31, 2015), pp. 679-687.
Figielski, T., "Photostriction Effect in Germanium," Phys. Status Solidi (b), vol. 1, Issue 4, 1961, pp. 306-316.
Finkelmann, H., et al., "A New Opto-Mechanical Effect in Solids," Physical Review Letters, vol. 87, No. 1, Jul. 2, 2001 (Published Jun. 15, 2001), pp. 015501-1-015501-4.
Frost, J.M., et al., "Atomistic Origins of High-Performance in Hybrid Halide Perovskite Solar Cells," Nano Letters, vol. 14, Issue 5, May 14, 2014 (Published Mar. 31, 2014), pp. 2584-2590.
Gil Escrig, L., et al., "Efficient photovoltaic and electroluminescent perovskite devices," Chem. Commun., vol. 51, 2015 (Published Nov. 13, 2014), pp. 569-571.
Green, M.A., et al., "Solar cell efficiency tables (Version 48)," Progress in Photovoltaics: Research and Applications, vol. 24, 2016 (First Published Jun. 17, 2016), pp. 905-913.
Im, J.-H., et al., "Growth of $CH_3NH_3PbI_3$ cuboids with controlled size for high-efficiency perovskite solar cells," Nature Nanotechnology, vol. 9, Nov. 2014 (Published online Aug. 31, 2014), pp. 927-932.
Jaffe, A., et al., "High-Pressure Single-Crystal Structures of 3D Lead-Halide Hybrid Perovskites and Pressure Effects on their Electronic and Optical Properties," ACS Cent. Sci, vol. 2, Apr. 6, 2016, pp. 201-209.
Kisielowski, C., et al., "Strain-related phenomena in GaN thin films," Physical Review B, vol. 54, No. 24, Dec. 15, 1996, pp. 17745-17753.
Knop, O., et al., "Alkylammonium lead halides. Part 2. $CH_3NH_3PbX_3$ (X = Cl, Br, I) perovskites: cuboctahedral halide cages with isotropic cation reorientation," Can. J. Chem., vol. 68, No. 3, Mar. 1990, pp. 412-422.
Kojima, A., et al., "Organometal Halide Perovskites as Visible-Light Sensitizers for Photovoltaic Cells," J. Am. Chem. Soc., JACS Communications, vol. 131, No. 17, 2009 (Published on the Web Apr. 14, 2009), pp. 6050-6051.
Korshunova, K., et al., "Thermodynamic stability of mixed Pb:Sn methyl-ammonium halide perovskites," Phys. Status Solidi B, vol. 253, No. 10, 2016 (Published online Jun. 24, 2016), pp. 1907-1915.
Kumawat, N.K., et al., "Band Gap Tuning of $CH_3NH_3Pb(Br_{1-x}Cl_x)_3$ Hybrid Perovskite for Blue Electroluminescence," ACS Applied Materials & Interfaces, vol. 7, No. 24, 2015 (Published on the Web Jun. 8, 2015), pp. 13119-13124.
Kundys, B., "Photostrictive materials," Applied Physics Review, vol. 2, No. 1, Article 011301, Mar. 2015 (Published online Jan. 16, 2015), pp. 1-13 (14 pages total).
Kundys, B., et al., "Light-induced size changes in $BiFeO_3$ crystals," Nature Materials, vol. 9, Oct. 2010 (Published online Jul. 25, 2010), pp. 803-805.
Kundys, B., et al., "Wavelength dependence of photoinduced deformation in $BiFeO_3$," Physical Review B, vol. 85, No. 9, Mar. 20, 2012, pp. 092301-1-092301-4.
Kutes, Y., et al., "Direct Observation of Ferroelectric Domains in Solution-Processed $CH_3NH_3PbI_3$ Perovskite Thin Films," The Journal of Physical Chemistry Letters, vol. 5, No. 19, 2014 (Published on the Web Sep. 15, 2014), pp. 3335-3339.
Lagowski, J., et al., "Photomechanical Effect in Noncentrosymmetric Semiconductors-CdS," Applied Physics Letters, vol. 20, Issue 1, Jan. 1, 1972, pp. 14-16 (4 pages total).
Lagowski, J., et al., "Photomechanical Vibration of Thin Crystals of Polar Semiconductors," Surface Science, vol. 45, Issue 2, Oct. 1974, pp. 353-370.
Lee, G.H., et al., "Blue shift in room temperature photoluminescence from photo-chemical vapor deposited ZnO films," Thin Solid Films, vol. 386, Issue 1, May 1, 2001, pp. 117-120.
Lee, J.-H., et al., "Role of hydrogen-bonding and its interplay with octahedral tilting in $CH_3NH_3PbI_3$," Chem. Commun., vol. 51, Mar. 5, 2015, pp. 6434-6437.
Lee, J.H., et al., "The nature of hydrogen-bonding interaction in the prototypic hybrid halide perovskite, tetragonal $CH_3NH_3PbI_3$," Scientific Reports, vol. 6, Feb. 19, 2016, pp. 1-12.
Lee, M.M., et al., "Efficient Hybrid Solar Cells Based on Meso-Superstructured Organometal Halide Perovskites," Science, vol. 338, Nov. 2, 2012 (Published online Oct. 4, 2012), pp. 643-647 (6 pages total).
Leguy, A.M.A., et al., "Dynamic disorder, phonon lifetimes, and the assignment of modes to the vibrational spectra of methylammonium lead halide perovskites," Phys. Chem. Chem. Phys., vol. 18, Issue 39, Oct. 21, 2016 (First Published Jun. 17, 2016), pp. 27051-27066.
Létoublon, A., et al., "Elastic Constants, Optical Phonons, and Molecular Relaxations in the High Temperature Plastic Phase of the $CH_3NH_3PbBr_3$ Hybrid Perovskite," The Journal of Physical Chemistry Letters, vol. 7, No. 19, 2016 (Published on the Web Sep. 7, 2016), pp. 3776-3784.
Li, B., et al., "Advancements in the stability of perovskite solar cells: degradation mechanisms and improvement approaches," RSC Advances, vol. 6, Apr. 8, 2016, pp. 38079-38091.
Li, X., et al., "Improved performance and stability of perovskite solar cells by crystal crosslinking with alkylphosphonic acid ω-ammonium chlorides," Nature Chemistry, vol. 7, Sep. 2015 (Published online Aug. 17, 2015), pp. 703-711.
Liu, S., et al., "Ferroelectric Domain Wall Induced Band Gap Reduction and Charge Separation in Organometal Halide Perovskites," The Journal of Physical Chemistry Letters, vol. 6, Issue 4, Feb. 19, 2015 (Published on the Web Jan. 22, 2015), pp. 693-699.
Lynden-Bell, R.M., et al., "Translation-rotation coupling, phase transitions, and elastic phenomena in orientationally disordered crystals," Reviews of Modern Physics, vol. 66, No. 3, Jul. 1994, pp. 721-762.

(56) References Cited

OTHER PUBLICATIONS

Mali, S.S., et al., "Highly stable and efficient solid-state solar cells based on methylammonium lead bromide ($CH_3NH_3PbBr_3$) perovskite quantum dots," NPG Asia Materials, vol. 7, e208, 2015 (Published online Aug. 14, 2015), pp. 1-9.

Misra, R.K., et al., "Temperature- and Component-Dependent Degradation of Perovskite Photovoltaic Materials under Concentrated Sunlight," The Journal of Physical Chemistry Letters, vol. 6, Issue 3, Feb. 5, 2015 (Published on the Web Dec. 30, 2014), pp. 326-330.

Mizoguchi, K., et al., "Determination of crystallographic orientations in silicon films by Raman-microprobe polarization measurements," Journal of Applied Physics, vol. 65, No. 7, Apr. 1, 1989, pp. 2583-2590 (9 pages total).

Mohiuddin, T.M.G., et al., "Uniaxial strain in graphene by Raman spectroscopy: G peak splitting, Grüneisen parameters, and sample orientation," Physical Review B: Condensed Matterand Materials Physics, vol. 79, Issue 20, May 2009 (Published May 29, 2009), pp. 205433-1-205433-8.

* cited by examiner

LIGHT-MODULATED, PEROVSKITE-BASED, ENERGY CONVERTING DEVICE

CROSS-REFERENCE TO RELATED APPLICATIONS

This application claims priority to U.S. Provisional Patent Application No. 62/681,778, filed on Jun. 7, 2018, entitled "LIGHT-MODULATED MECHANICAL DEFORMATION IN PEROVSKITE," the disclosure of which is incorporated herein by reference in its entirety.

BACKGROUND

Technical Field

Embodiments of the subject matter disclosed herein generally relate to a photostrictive material that exhibits light-matter interactions, and more specifically, to a light-modulated, perovskite-based, energy converting device that converts light energy into mechanical or electrical energy.

Discussion Of The Background

Organic-inorganic hybrid perovskites ($RNH_3MeX_3$, in which R is an organic group, Me is Pb or Sn, and X is a halogen) display an interesting combination of optoelectronic properties, including direct band gaps, high photoluminescence (PL) efficiencies, long carrier lifetimes, and high mobilities. Researchers have exploited these valuable qualities to great effect in various applications, such as solar cells, photodetectors, light-emitting diodes, and lasers. In particular, the efficiencies of perovskite solar cells have tremendously increased over the last seven years, from 3.8% to over 22.1%, thus distinguishing these materials for next generation photovoltaics. This outstanding incident photon-to-electron conversion efficiency and the fundamental light-matter interactions of organic-inorganic hybrid perovskites also suggest the likelihood that these materials exhibit photostriction.

The photostrictive effect is defined as a change in the internal strain of a material as a resulting of an interaction with an external electromagnetic wave, and it is of interest for future wireless remote control devices, such as microactuators and microsensors. This phenomenon has been observed in many materials, including semiconductors and ferroelectric compounds. However, the largest photostrictive efficiencies occur in organic materials as a result of photoisomerization. Unfortunately, the ambient instability and slow response time of the organic photostrictive materials have limited their technical applications. In nonpolar semiconductors, the photostriction effect depends on the susceptibility of the band gap to pressure and, as a result, is relatively small due to the strong covalent bonds that are typical of these materials.

In ferroelectric materials and polar semiconductors, researchers have ascribed the photostrictive mechanism to a combination of the photovoltaic and converse piezoelectric effect. For example, the perovskite oxide $BiFeO_3$ (BFO) was recently shown to display room temperature photostriction that was fast and large ($8.2\times10^{-12}$ $m^3W^{-1}$), thus attracting further investigation of the photostrictive effect in perovskite materials.

Zhou et al. was the first to demonstrate photostriction ($4\times10^{-10}$ $m^3W^{-1}$) in an organic-inorganic hybrid perovskite, specifically methylammonium (MA) lead triiodide ($CH_3NH_3PbI_3$, also called $MAPbI_3$).[1] Despite this large photostrictive efficiency, $MAPbI_3$ easily decomposes due to the long and weak Pb—I bond, which is very sensitive to moisture. For example, the efficiency of an unsealed $MAPbI_3$-based solar device degraded by almost 30% after 30 days of exposure to room temperature ambient air and 55% relative humidity.

For most practical applications, such a short life of this photostrictive material is not feasible. Thus, in order to take advantage of the large photostrictive effect observed in $MAPbI_3$, for practical applications, a way has to be found to improve the stability of the organic-inorganic hybrid perovskites.

Thus, there is a need to find a new material that is stable to various temperatures and humidity ranges, and also exhibit a photostrictive effect, so that this material can be used as a light-modulated energy converting device.

SUMMARY

According to an embodiment, there is an energy converting device that includes a base which is fixed; a methylammonium lead bromide ($MAPbBr_3$) material having a first end fixedly attached to the base and a second end free to move; and an actuator block attached to the second end of the $MAPbBr_3$ material. The actuator block moves relative to the base when the $MAPbBr_3$ material is exposed to light.

According to another embodiment, there is an energy converting device that includes a methylammonium lead bromide ($MAPbBr_3$) material having a first end fixedly attached and a second end free to move, and the second end of the $MAPbBr_3$ material moves relative to the first end when the $MAPbBr_3$ material is exposed to light, thus converting light energy to mechanical energy.

According to still another embodiment, there is a method for converting light energy into a different energy. The method includes illuminating a $MAPbBr_3$ material with light; and displacing an actuating block with the $MAPbBr_3$ material as the $MAPbBr_3$ material changes a size due to the light.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

Figure 1:
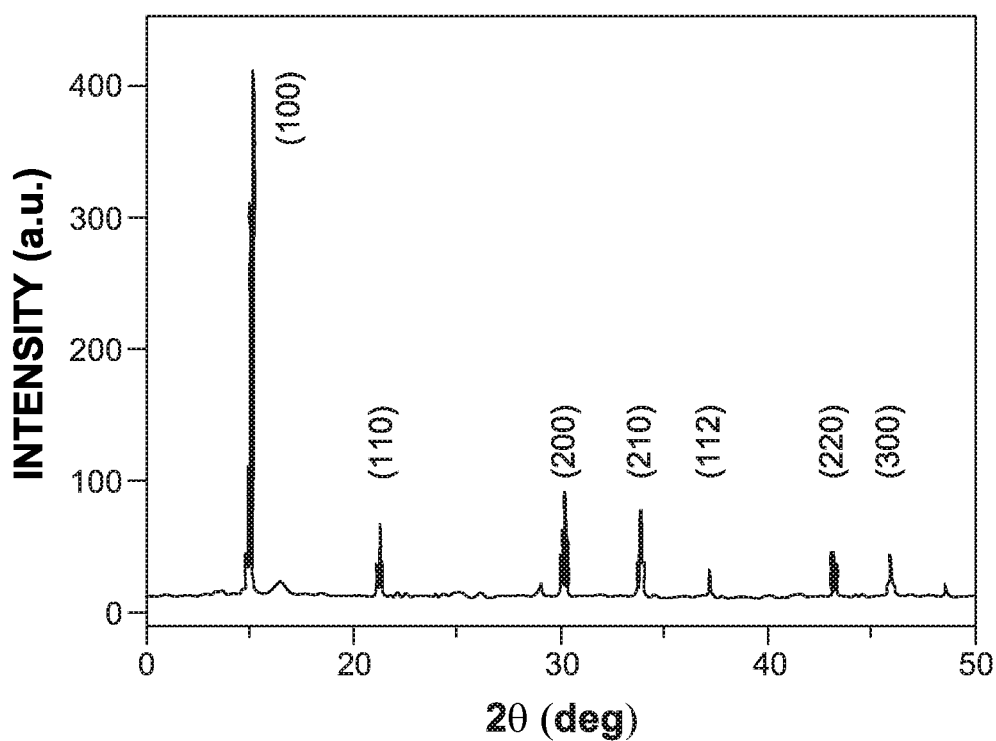
FIG. 1 illustrates an intensity of a $MAPbBr_3$ material using powder X-ray diffraction (XRD)

The following description of the embodiments refers to the accompanying drawings. The same reference numbers in different drawings identify the same or similar elements. The following detailed description does not limit the invention. Instead, the scope of the invention is defined by the appended claims. For simplicity, the following embodiments are discussed with regard to an energy converting device that uses the photostrictive effect of the MAPbBr$_3$ material. However, the embodiments discussed herein are not limited to an energy converting device, but they may be used in other devices.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, methylammonium lead bromide (CH$_3$NH$_3$PbBr$_3$ or MAPbBr$_3$ herein) thin films are used to build a light-modulated energy converting device. The MAPbBr$_3$ thin films are moisture-insensitive, exhibiting promising long-term stability in ambient atmosphere with high relative humidity for five months.[2] This organic-inorganic hybrid perovskite features a cubic structure,[3] as well as Pb—Br bonds, which are stronger and shorter compared to the Pb—I bonds of the MAPbI$_3$ material, suggesting it as an alternative material for realizing photostrictive applications with long-term stability.[4]

Moreover, the MAPbBr$_3$ material features useful intrinsic properties, such as a direct band gap (1.93-2.3 eV), a high absorption coefficient in the visible region (4×104 cm$^{-1}$ at 532 nm), low Urbach energy (23 meV), and high carrier mobility (24.0 cm$^2$ V$^{-1}$ s$^{-1}$). Compared to MAPbI$_3$, the higher band gap of MAPbBr$_3$ enables devices using such material to be operated at higher temperatures. In addition, the MAPbBr$_3$ material has unique optical and electrical properties (e.g., large optical nonlinearity), which is not found in MAPbI$_3$. The MAPbBr$_3$ material also exhibits excellent p-type conductivity that is superior to that of MAPbI$_3$ material. Although these optical, electrical, and optoelectronic properties of the MAPbBr$_3$ material have been studied in detail, there have been no reports of photostriction or direct evidence of light-matter interactions for such a material.

Thus, the inventors have studied the MAPbI$_3$ material and found that this material is not only stable under various temperature and humidity ranges, but also exhibits a good photostriction effect. The procedure and experiments performed to discover this quality of the MAPbI$_3$ material are discussed first, followed by various applications of this effect.

Researchers commonly use atomic force microscopy (AFM) to measure photostriction.[1] However, heating-induced bending, expansion, and slow thermal relaxation of the AFM tip can cause errors and artefacts in the photostriction measurements. Photostriction can also be studied using a cantilever structure. However, this method requires large sample crystals. In addition, although these techniques can measure the direct deformation of materials, the absorption depth of light must also be considered in order to improve the accuracy of the photostriction measurement. Taking the sample thickness into account while measuring the material's intrinsic photostrictive effect is particularly important for perovskites due to the shallow penetration depth of incident light,[1] necessitating the need to cleave the crystals into small flakes. The uncertainty of these kinds of measurements and the inconvenient experimental design thus motivated the inventors to develop an alternative system and procedure for studying the photostriction effect in the MAPbBr$_3$ material, which by itself is novel.

Using this alternative system, the inventors have demonstrated the previously unknown photostrictive effect of the MAPbBr$_3$ material, using in situ Raman analysis with confocal microscopy. The contactless nature of Raman spectroscopy and its high-spatial resolution make this technique a favorable alternative for measuring the photostriction effect. In addition, the confocal microscopy setup provides high spatial resolution, particularly in the z-plane, which enables to obtain internal structural information of the sample material while strongly reducing the background signal, thus negating the need for thickness-dependent measurements. Moreover, there have been many studies that use Raman scattering measurements to analyze strain variation in different materials (e.g., Si, GaN, ZnO nanorods, and graphene). These studies have demonstrated that Raman spectroscopy is a very powerful and accurate tool for the study of lattice strain, and as a result, the technique has been widely accepted in this field.

By analyzing the blue shifts in the optical phonon modes of a single crystal MAPbBr$_3$, the presence of light-induced deformation of the material was observed. The photostrictive effect was also studied using in situ spectroscopic measurements while applying a mechanical strain. By comparing the observed blue shifts caused by photostriction and the applied strain, a relationship between the incident light power, the Raman peak shift, and the lattice structure deformation (i.e., strain) was determined, and a general equation of the photostriction in MAPbBr$_3$ crystals was proposed that does not require thickness-dependent measurements. In this manner, in situ Raman spectroscopy with confocal microscopy was demonstrated as a powerful characterization tool for conveniently measuring the intrinsic photoinduced lattice deformation that could be applied to other materials. With this method, the photostrictive contraction of a single crystal of MAPbBr$_3$ was observed to exhibit a strain as high as 1.25% at room temperature. This behavior also showed no sign of decay after 30 d, even without encapsulation. Furthermore, using power-dependent PL analysis, it was also observed a change in the band gap of the material due to the photostrictive effect. The strong and stable photon-lattice coupling of the single crystal MAPbBr$_3$ material suggests this organic-inorganic hybrid perovskite is a good fit for novel optical micro-electromechanical devices, which are discussed later.

For the experiments now discussed, mm-scale grains of single crystal MAPbBr$_3$ were synthetized using the antisolvent vapor-assisted crystallization method, which is well suited for the growth of large, uniform, and high quality single crystals at low cost. The MAPbBr$_3$ crystals were found to be orange and featured parallel rectangular facets. The MAPbBr$_3$ material featured a perovskite phase, which was determined by using powder X-ray diffraction (XRD), as illustrated in FIG. 1. Single-crystal XRD analysis of the material showed a strong match with previously reported single crystal MAPbBr$_3$ grown at room temperature. The crystal perovskite structure of the MAPbBr$_3$ material has the MA cation located at the center of the regular cube surrounded by eight PbBr$_6$ octahedra. The MA cations are arranged in a random orientation due to their large orientational mobility and interact with the PbBr$_6$ octahedra by hydrogen bonding to the bromine atoms. The MA torsional movements are sensitive to the surrounding lattice cages, which suggests the peak position in the Raman spectra corresponding to this vibration could be used to estimate the variation of the lattice structure.

Figure 2:
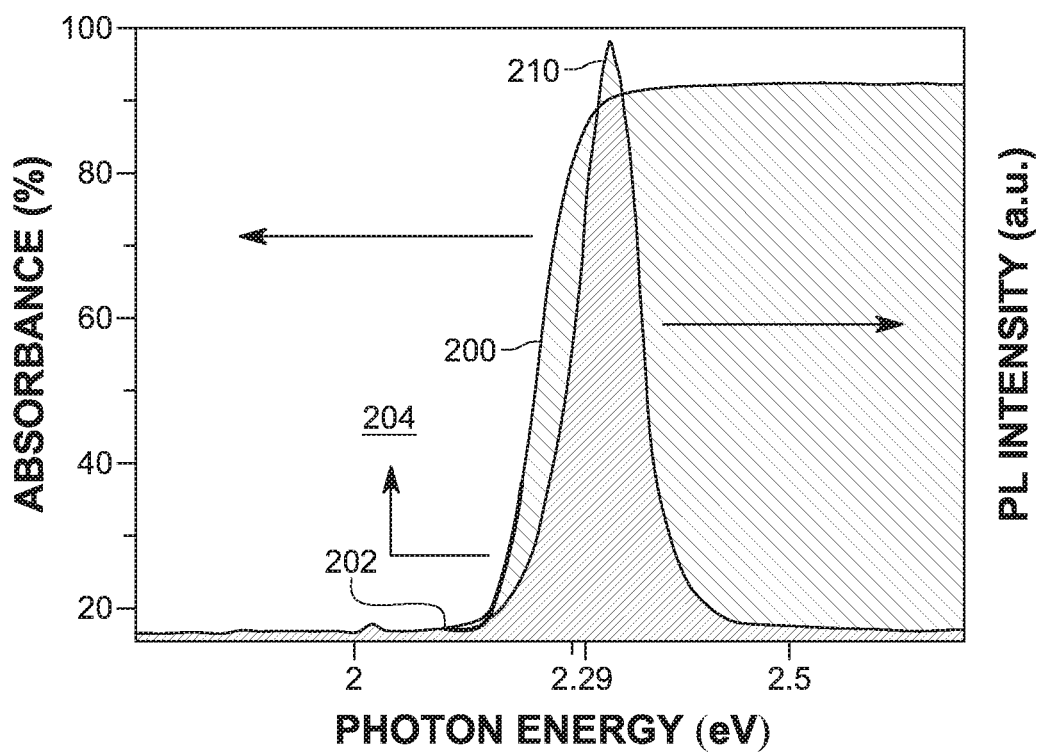
FIG. 2 illustrates the absorbance and room temperature PL spectrum of the $MAPbBr_3$ material.

To investigate the optical properties of the MAPbBr$_3$ crystals, the material's absorbance and room temperature photoluminescence (PL) spectrum were measured as illustrated in FIG. 2. The absorbance 200 was over 90% at photon energies higher than 2.3 eV (539 nm). The edge of the optical absorption was sharp, with an Urbach energy (Eu) 202 of just 13 meV, which is comparable with other previously reported high quality MAPbBr$_3$ crystals. Note that the Urbach energy is given by $A(h\nu)=a_0 e^{h\nu/(Eu)}$, in which A is the absorbance, $a_0$ is a constant, and $h\nu$ is the excitation energy in eV. The low value of the Urbach energy indicates that the MAPbBr$_3$ material has a very low-degree of structural disorder and high-crystallinity. Moreover, the tail 204 of the absorption curve (also called the Urbach tail) shows a purely exponential trend, suggesting the lack of optically detectable deep states within the band gap. The PL peak 210 at 2.29 eV has a full width at half maximum of 154 meV, which is also in good agreement with previously reported results of single crystal MAPbBr$_3$.

Next, the phase of the sample material was investigated. For this part, Raman spectroscopy was used as this technique is a powerful tool for identifying amorphous or crystalline phases of materials, as well for measuring both tensile and compressive lattice strains. In single crystalline materials, the Raman intensity depends on the polarization direction of the incident and scattered light relative to the main crystallographic orientation. According to the Raman selection rules, the measured Raman intensity follows equation (1):

$$I \cong |e_i \Phi \Re \Phi^T e_s|^2, \quad (1)$$

in which I is the scattering Raman intensity, $\Phi$ is the orthogonal transformation matrix, $\Re$ is the Raman tensor, and $e_i$ and $e_s$ are the polarization unit vectors of the electric field for the incident and scattered laser beams, respectively. In a backscattering geometry, when the sample is rotated with an angle $\theta$ around the z-axis, $\Phi$ is given by:

$$\Phi = \begin{pmatrix} \cos\theta & \sin\theta & 0 \\ -\sin\theta & \cos\theta & 0 \\ 0 & 0 & 1 \end{pmatrix}. \quad (2)$$

For crystalline MAPbBr$_3$ material with a cubic space group of Pm-3m, the Raman tensor of the A$_2$ mode appears at 318 cm$^{-1}$ and can be expressed by Equation (3):

$$\Re = \begin{pmatrix} 0 & a & 0 \\ a & 0 & 0 \\ 0 & 0 & 0 \end{pmatrix}. \quad (3)$$

Based on equations (1) to (3), the Raman intensity variation with respect to the in-plane rotation angle can be expressed as follows:

$$S = \eta \sin^2 2(\theta), \quad (4)$$

in which S is the Raman intensity, $\eta$ is the proportionality constant that depends on the frequency of the scattered light and the energy of the input laser beam, and $\theta$ is the rotation angle.

To verify the crystallinity of the studied MAPbBr$_3$ material, the polarized Raman spectrum of the A2 mode at 318 cm$^{-1}$ was measured using a backscattering configuration (Z(XX)Z) as the sample was rotated around the z-axis. In the Z(XX)Z convention, the two letters on either side of the parentheses represent the propagation direction of the incident and scattered light, respectively. The scattering intensity of the MAPbBr$_3$ crystal displayed a period of ≈90°, with a maximum amplitude at $\theta=36°$, 126°, 225°, and 315° indicating that the MAPbBr$_3$ sample is a single crystal.

Figure 3A:
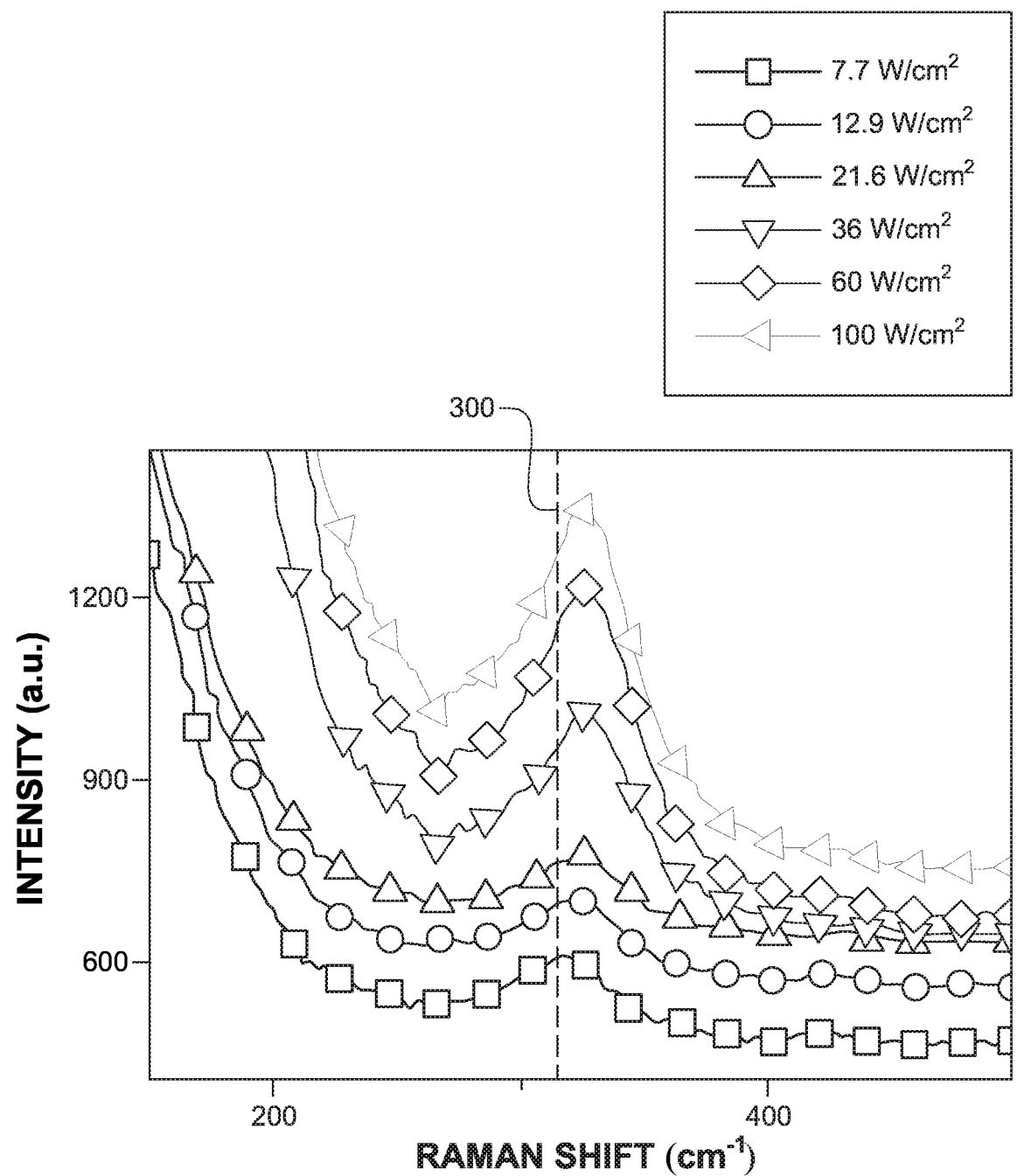
FIGS. 3A and 3B illustrate the Raman intensity and peak positions of the $MAPbBr_3$ material.

The photostriction of the MAPbBr$_3$ sample material was investigated using excitation power-dependent Raman measurements, which are illustrated in FIG. 3A. As the excitation intensity increased from 7.7 to 60 W cm$^{-2}$, it was observed that the Raman peak 300 (A2 mode) shifted toward blue, from 317.5 to 328.2 cm-1. This phonon mode corresponds to the rotation of the whole MA cation around the C—N axis, which plays a key role in structural stabilization of the perovskite. Note that all the spectra in this study were recorded with an acquisition time of 1 s and an accumulation number of 10 to ensure sufficient signal was collected to determine an accurate peak position and to reduce thermal effects that can cause inaccurate measurements.

Figure 3B:
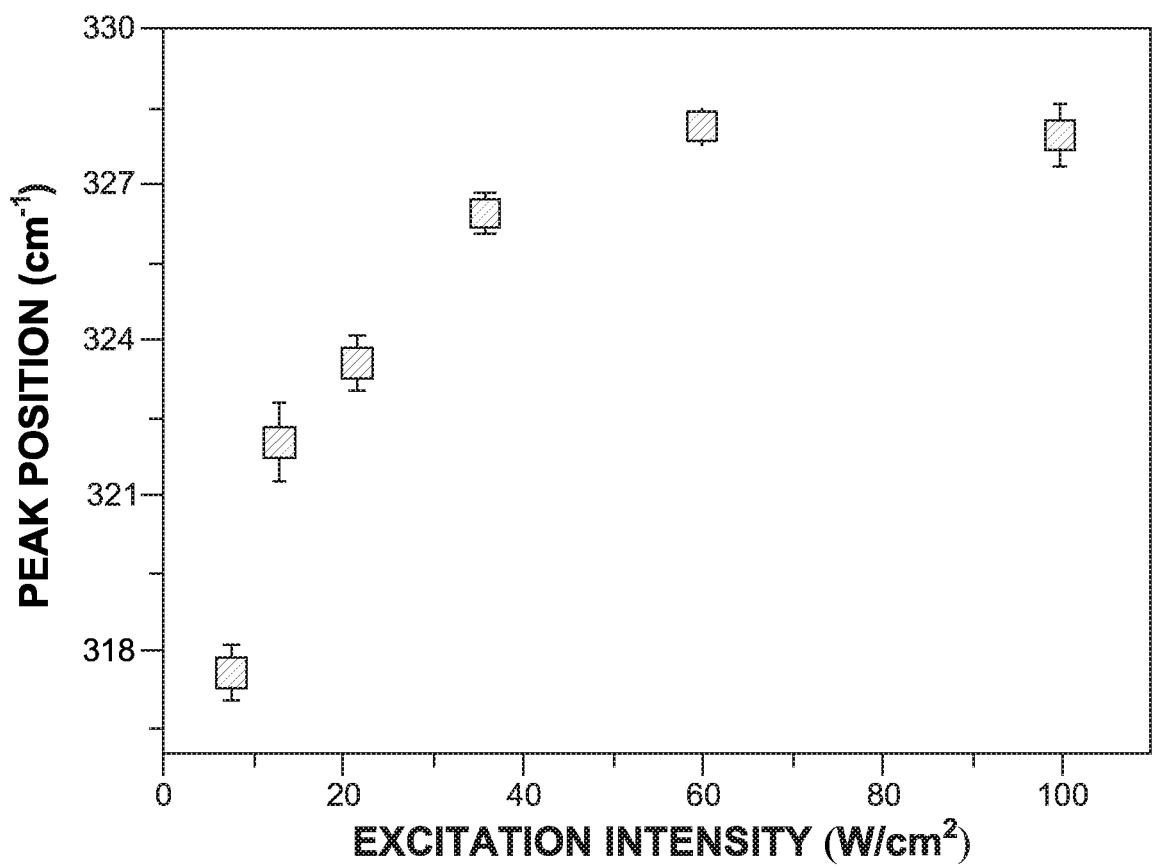

The blue shifting trend eventually saturated after the laser excitation intensity exceeded 60 W cm$^{-2}$, as illustrated in FIG. 3B. In general, lattice contraction leads to a blue shift in the Raman peak position, while lattice expansion results in red shifting behavior. The blue shift that was observed in the Raman spectrum shown in FIGS. 3A and 3B indicates that the MAPbBr$_3$ crystal lattice contracts due to the incident light, confirming that this perovskite material displays the photostrictive effect.

To exclude the deformation of the crystal structure due to thermal effects, the temperature of the MAPbBr$_3$ sample material was measured using an IR camera under laser illumination. During the illumination, the surface temperature of the crystal only increased by 0.3° C. (from 20.7 to 21.0° C.) for the strongest laser intensity that was used for the Raman experiments (100 W cm$^{-2}$). The small temperature change therefore allowed to disregard thermal effects in the photostriction measurements.

Figure 4A:
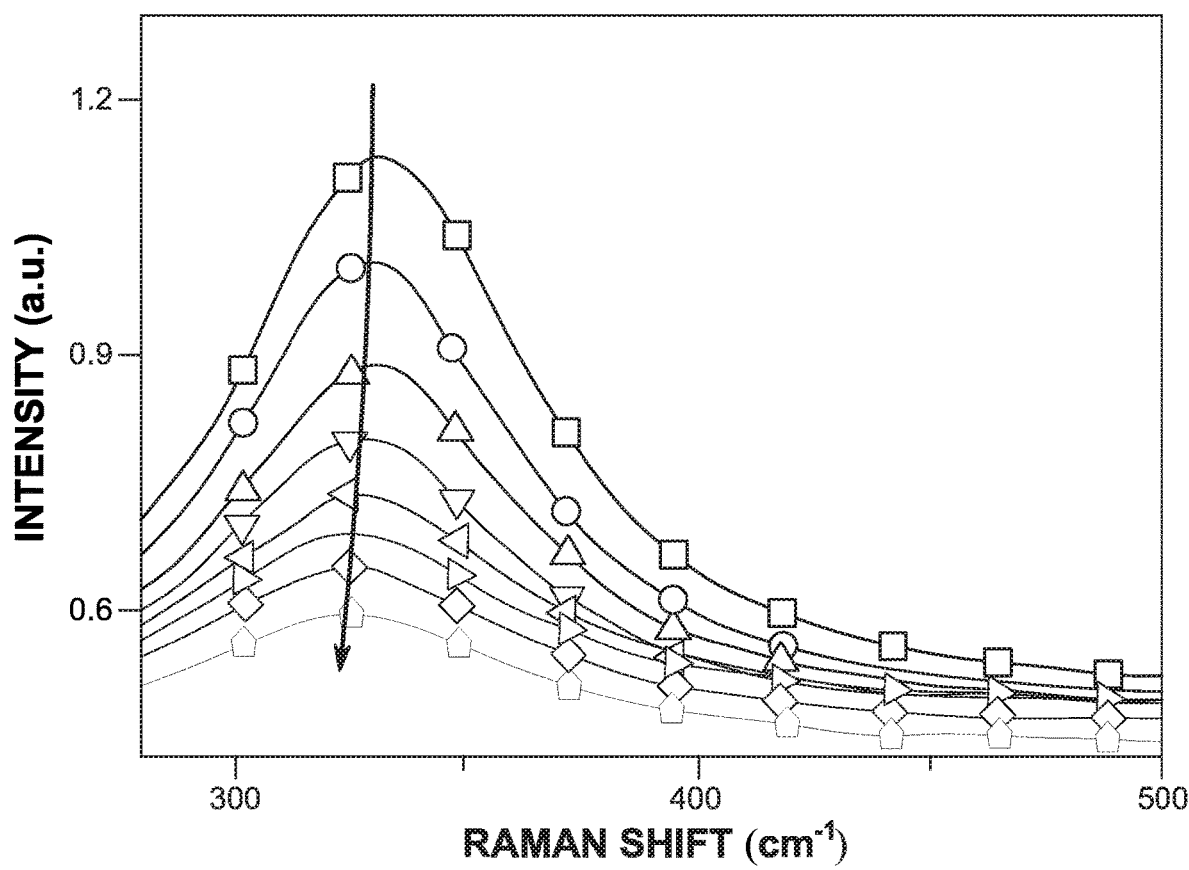
FIGS. 4A and 4B illustrate the Raman intensity and peak positions at different temperatures for the $MAPbBr_3$ material.
Figure 4B:
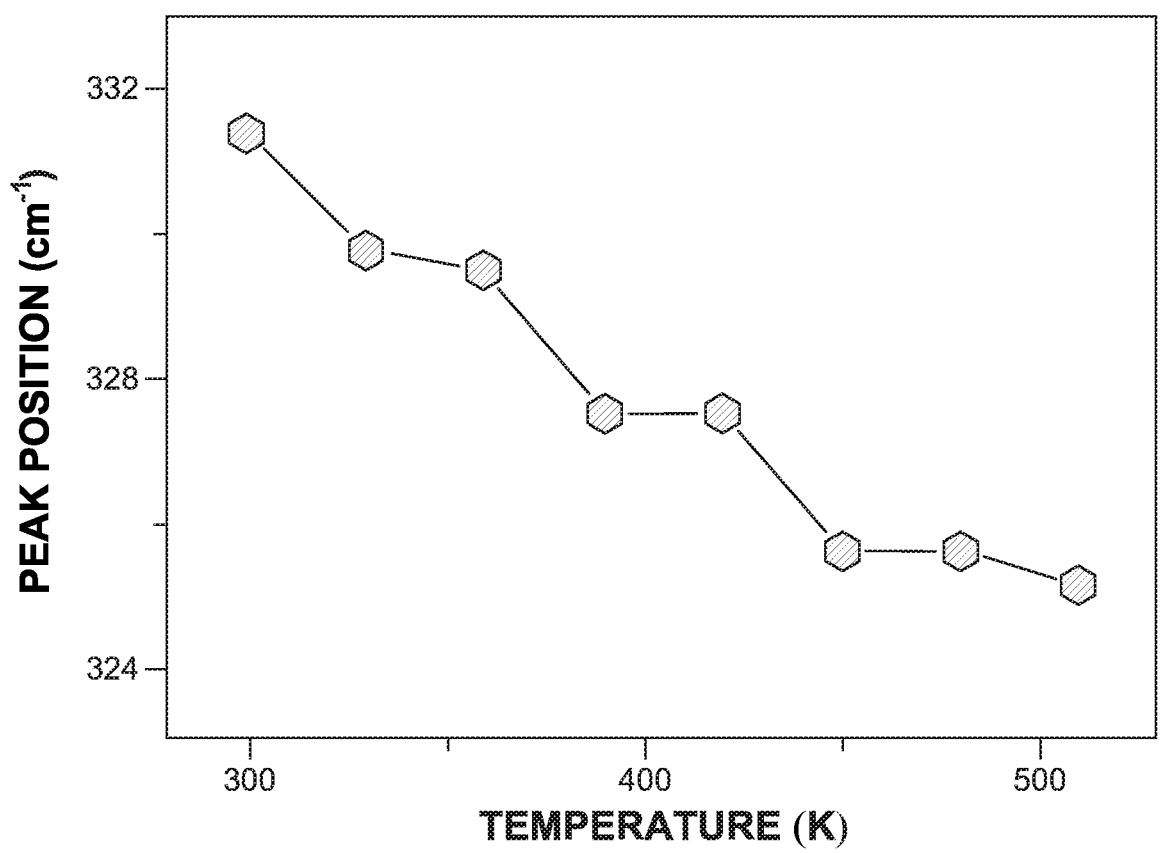

To further confirm that the observed Raman shifts were caused by photostriction and not by other causes, additional Raman spectra of the MAPbBr$_3$ sample crystals were measured at different temperatures. FIGS. 4A and 4B show the Raman spectra and peak positions of the sample material as a function of temperature. As the temperature was increased from 300 to 510 K, the Raman spectra broadened and red shifted from 331.4 to 325.6 cm$^{-1}$, which is the opposite result from the blue shifting power-dependent Raman measurements illustrated in FIGS. 3A and 3B. This temperature-dependent red shift and weakening Raman intensities is attributed to the thermal-induced lattice expansion of the crystal. These temperature-based results help verify that compressive strain under laser illumination is the dominant cause of the observed Raman shifts of the MAPbBr$_3$ sample crystals rather than the thermal effects.

Figure 5A:
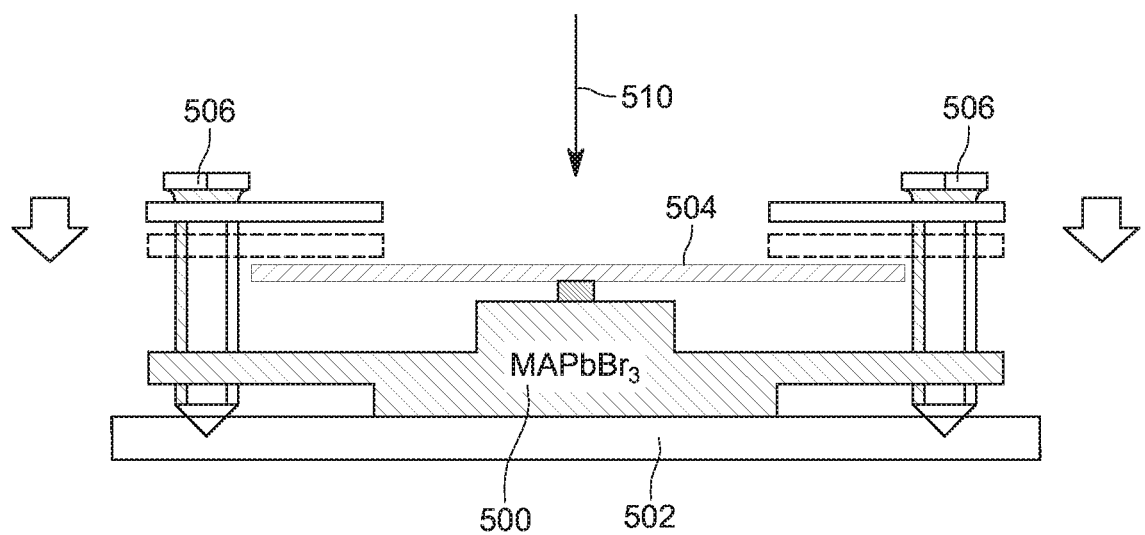
FIG. 5A illustrates an experimental setup that is used to measure the Raman shift of the $MAPbBr_3$ material under strain.

To estimate the magnitude of the strain in the MAPbBr$_3$ sample crystals caused by the photostrictive effect, the in situ Raman spectrum was compared with samples under external mechanical compression. By clamping an individual MAPbBr$_3$ crystal 500 (for example, 3.6 mm in length, 2.8 mm in width, and 2.7 mm in thickness) to a sample stage 502 using a 1 cm×1 cm piece of quartz 504, as shown in FIG. 5A, it is possible to control the magnitude of the strain applied to the sample using screws 506 at the four sides of the quartz 504. The value of the uniaxial strain applied was calculated by counting the displacement of the screw threads.

Figure 5B:
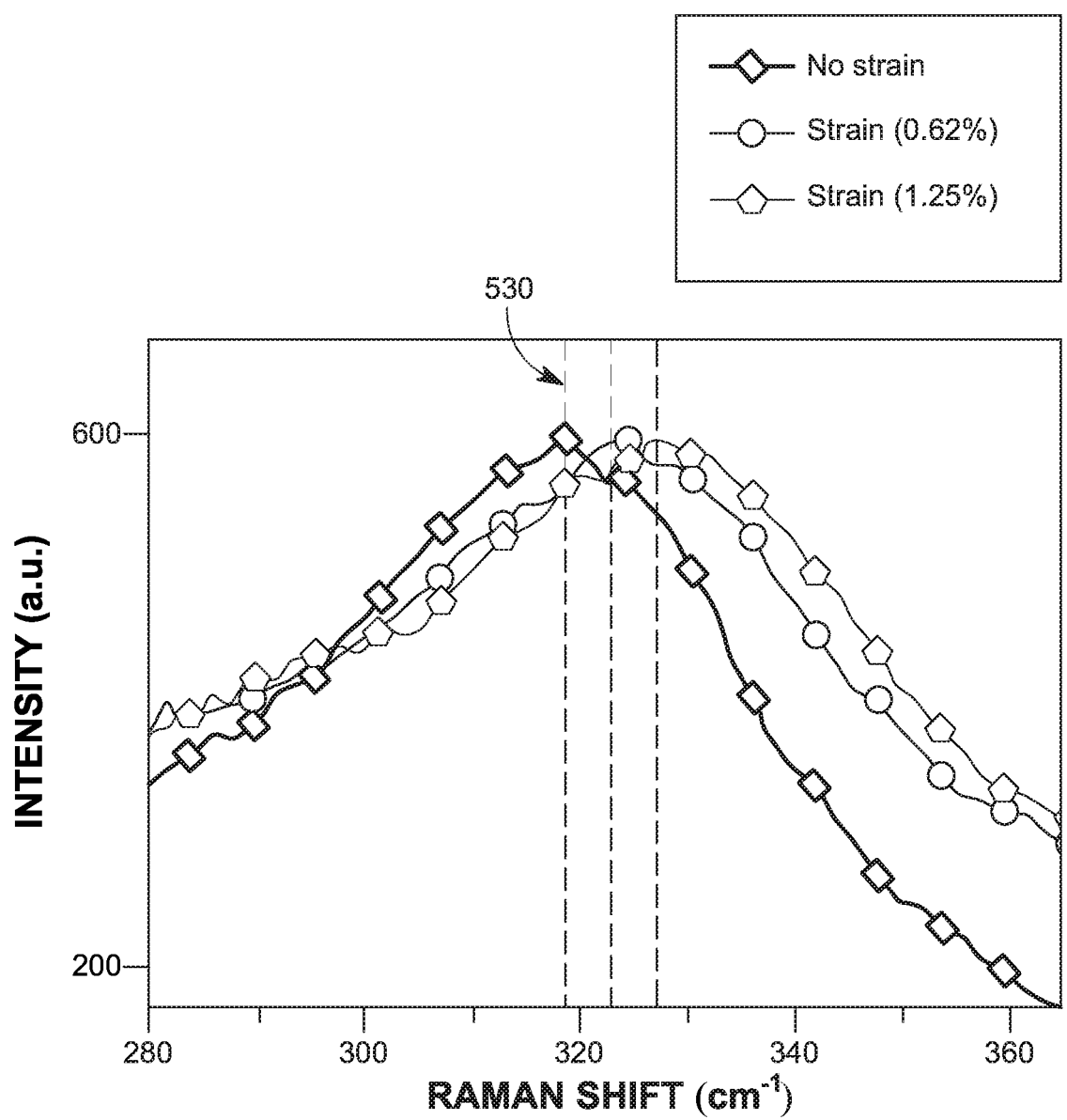
FIG. 5B illustrates the intensity of the $MAPbBr_3$ material versus the Raman shift for various strains.

The sample 500 was then illuminated with a laser beam 510 generated by a laser having a low-intensity of 7.7 mW cm$^{-2}$ (to avoid photoinduced lattice strain) and began taking Raman measurements without external compression. As an external mechanical strain of 0.62% was applied with screws 506 to the MAPbBr$_3$ crystal 500, it was observed that the Raman peak 530 shifted toward blue by 5.82 cm$^{-1}$, as illustrated in FIG. 5B. As the external strain was increased to 1.25%, the Raman peak blue shifted by 9.69 cm$^{-1}$. These Raman shifts under mechanical strain correspond to the same peak shifts of the MAPbBr$_3$ sample at a laser illumination power of 36 and 60 W cm$^{-2}$, respectively (see FIG. 3B). The external strain greater than 1.25% resulted in no further shift in the peak position.

Figure 5C:
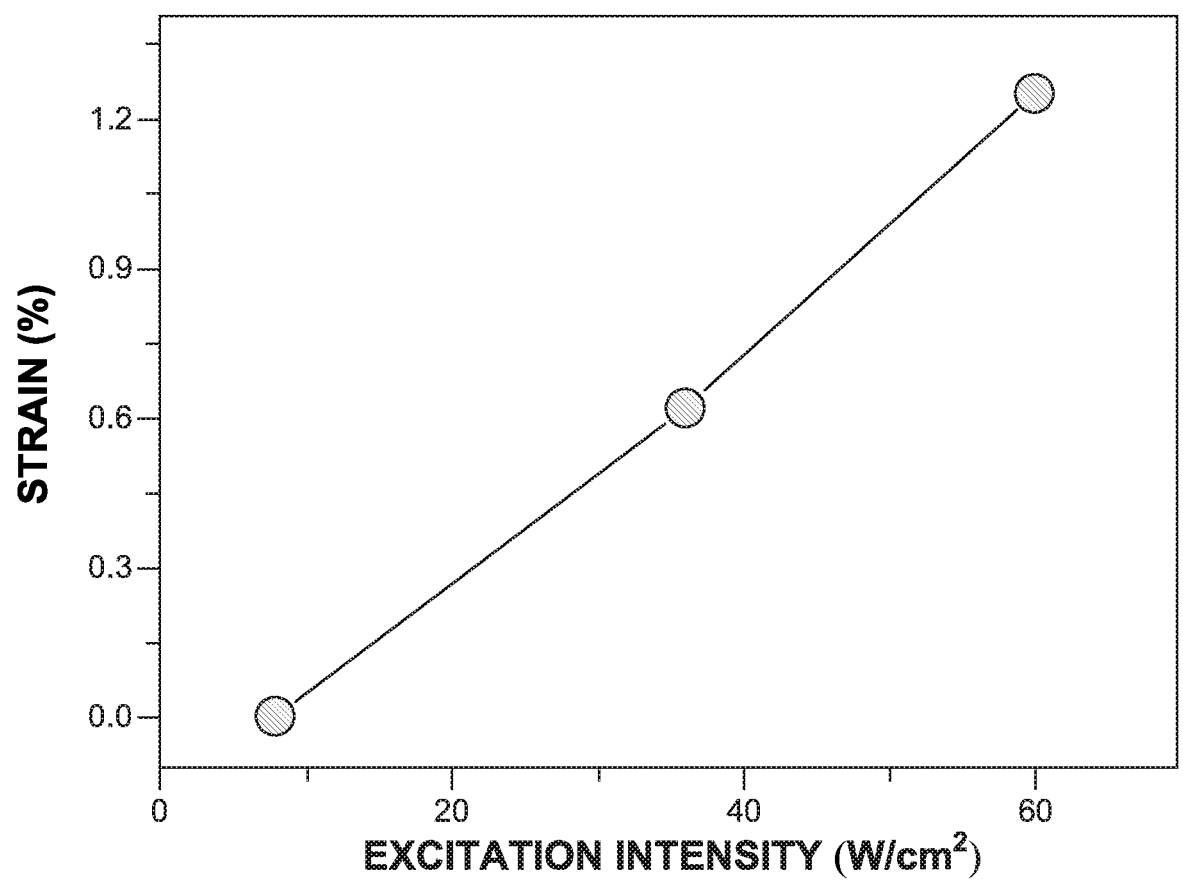
FIG. 5C illustrates the strain applied to the $MAPbBr_3$ material versus the excitation intensity.

These results confirmed that the Raman shift previously observed for the illumination of the MAPbBr$_3$ sample crystal correspond to a compressive strain, which was plotted in FIG. 5C versus the excitation intensity. However, it should be noted that the light-induced lattice distortions are likely to be much more complicated than just a result of a homogeneous strain. In fact, this compressive lattice strain observed in one direction is exactly the result of complex distortions.

The photoinduced pressure, by the laser irradiation, in a material can be defined as:

$$P = P_1^0\left(\frac{V_0 - V}{V_0}\right) + P_2^0\left(\frac{V_0 - V}{V_0}\right)^2 + \frac{1}{V}\sum_j \gamma_j \frac{h\nu_j}{e^{(h\nu_j - KT)} - 1}, \quad (5)$$

where V is the volume of the material, γ is the Gruneisen coefficient, h is Planck's constant, v is the frequency, K is Boltzmann's constant, and T is the temperature. The coefficient γ describes the effect of a volume changing of a crystal lattice on its phonon vibrational properties.

The first two terms in equation (5), on the right-hand side, are the pressure at the absolute zero of temperature, and the last term on the right-hand side expresses the thermal pressure in terms of the usual Gruneisen parameter. The first two terms are nonthermal contributions from pressure and exist even at absolute zero. Regardless of whether the Gruneisen parameter of the observed phonon mode is positive or negative, the photostrictive effect in the MAPbBr$_3$ sample material is still visible.

From the relationship between the Raman blue shift and the magnitude of the photoinduced strain, it is possible to calculate the phonon deformation potential, as described by equation (6), $$\Delta\omega_j = K_{i\varepsilon xx} + K_{i\varepsilon yy} K_{i\varepsilon zz}, \quad (6)$$

in which $\Delta\omega_j$ is the phonon frequency shift, $K_i$ is the phonon deformation potential, and εxx, εyy, and εzz are the lattice variations along the a, b, and c axes, respectively. Because the external uniaxial strain is along the c-axis, the equation simplifies to $\Delta\omega_j = K_{i\varepsilon xx}$. Based on the value of the photoinduced blue shift and 1.25% externally applied strain (see FIG. 5C), the phonon deformation potential of the single crystal MAPbBr$_3$ is estimated to be −856 cm$^{-1}$. The photostrictive coefficient can be defined as $$\frac{\lambda_{h\nu}}{I},$$

in which $\lambda_{h\nu}(=\Delta L/L)$ is the light-induced deformation (i.e., the strain shown in FIG. 5C), and I is the intensity of the light. Based on this equation, it was determined that the maximum photostrictive efficiency of the sample single crystal MAPbBr$_3$ is 2.08×10$^{-8}$ m$^2$W$^{-1}$ at an excitation intensity of 60 W cm$^{-2}$. This efficiency is in the same order of magnitude with the BiFeO$_3$ material under a 365 nm illumination (9.2×10$^{-8}$ m$^2$W$^{-1}$) and the MAPbI$_3$ material (5×10$^{-8}$ m$^2$W$^{-1}$), two times higher than the BiFeO$_3$ under 633 nm illumination (2×10$^{-10}$ m$^2$W$^{-1}$), and 108 times greater than Si (3.4×10$^{-17}$ m$^2$W$^{-1}$).

Figure 6A:
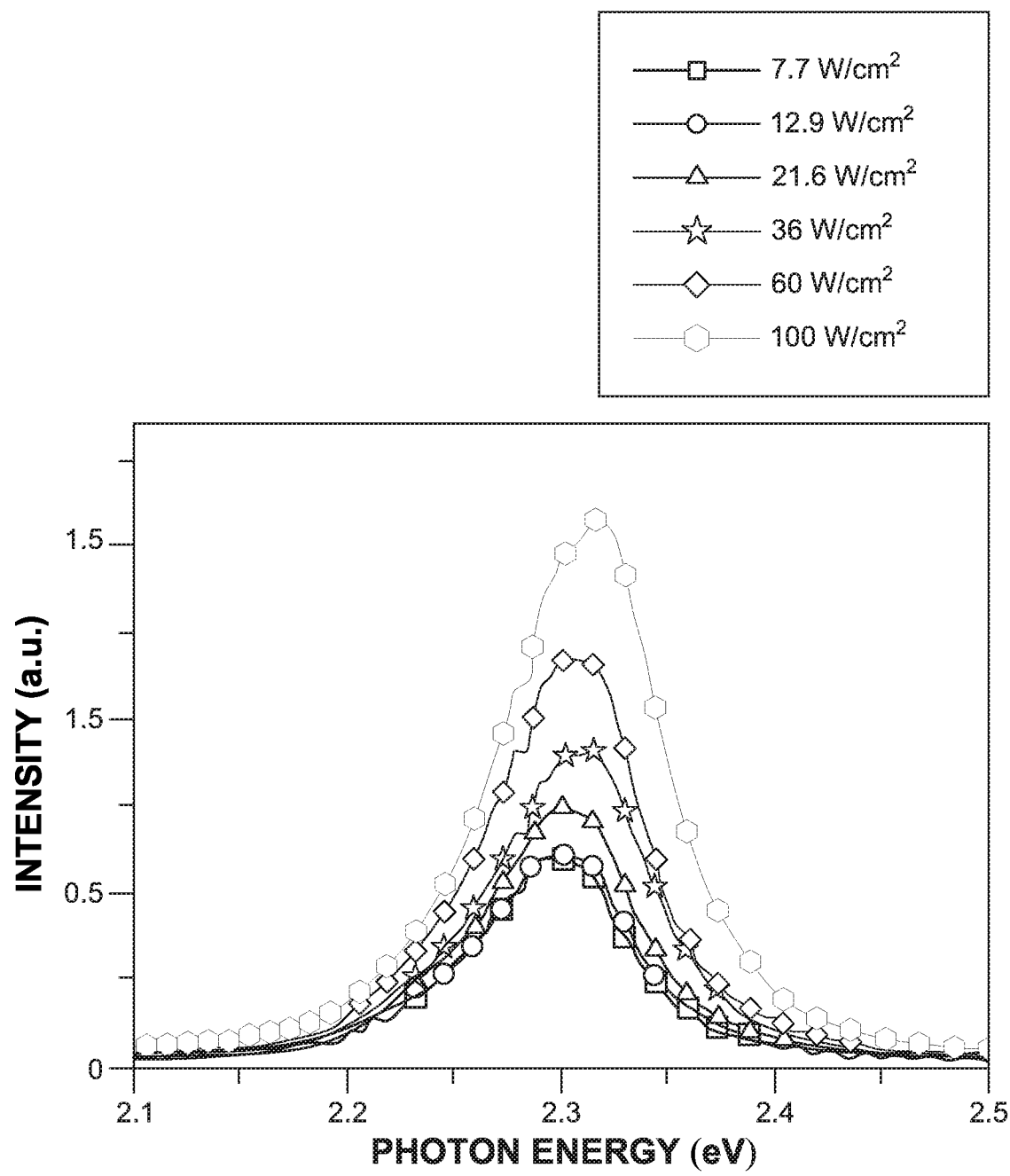
FIGS. 6A and 6B show the blue shift and increase in the intensity of the PL emission with increasing laser power for the $MAPbBr_3$ material.
Figure 6B:
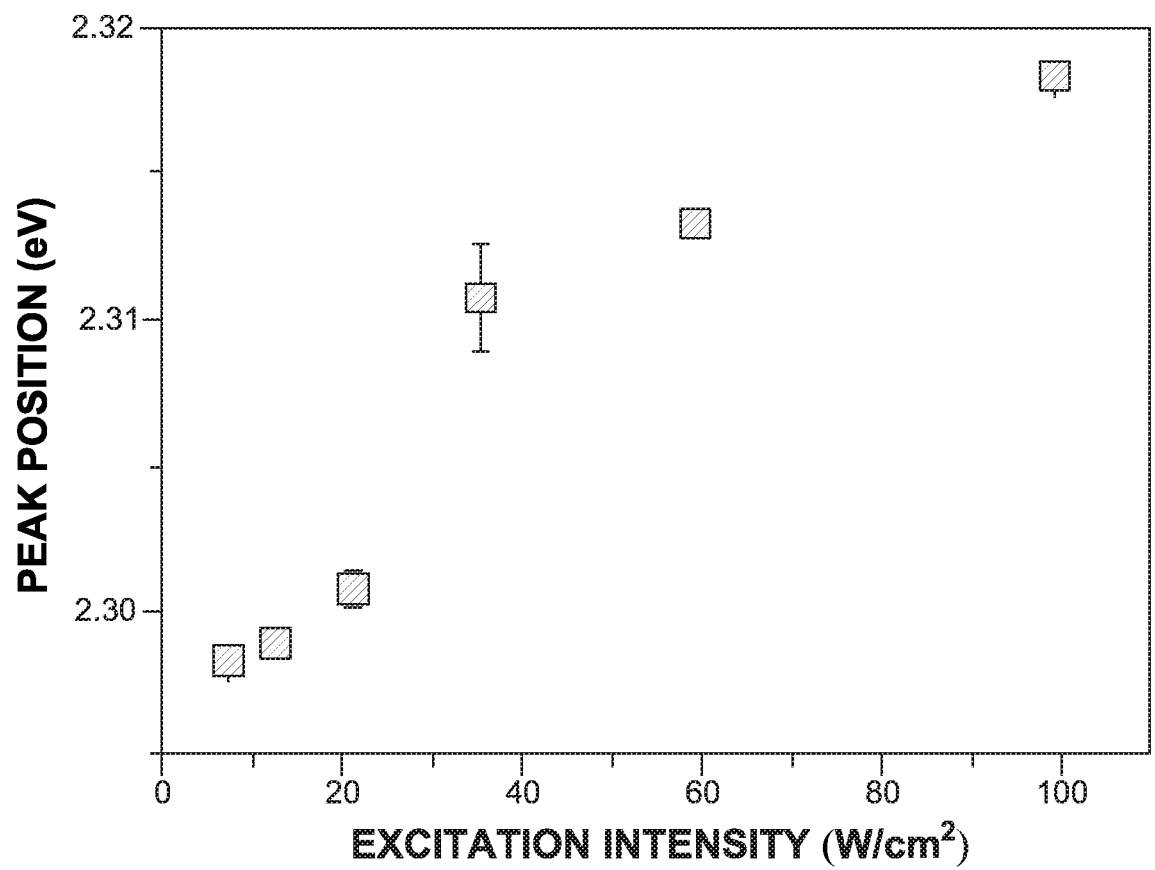

Because the effect of strain on the MAPbBr$_3$ material should also affect its band structure, the excitation-power-dependent PL spectra of the sample was measured to investigate any changes in the band gap. FIGS. 6A and 6B show a blue shift and increase in the intensity of the PL emission with an increase in the laser power (from 7.7 to 100 W cm$^{-2}$), which could be attributed to the Burstein-Moss effect and/or compression of the lattice structure, which has been previously observed in other hybrid perovskite materials, including single crystal MAPbBr$_3$.

Figure 6C:
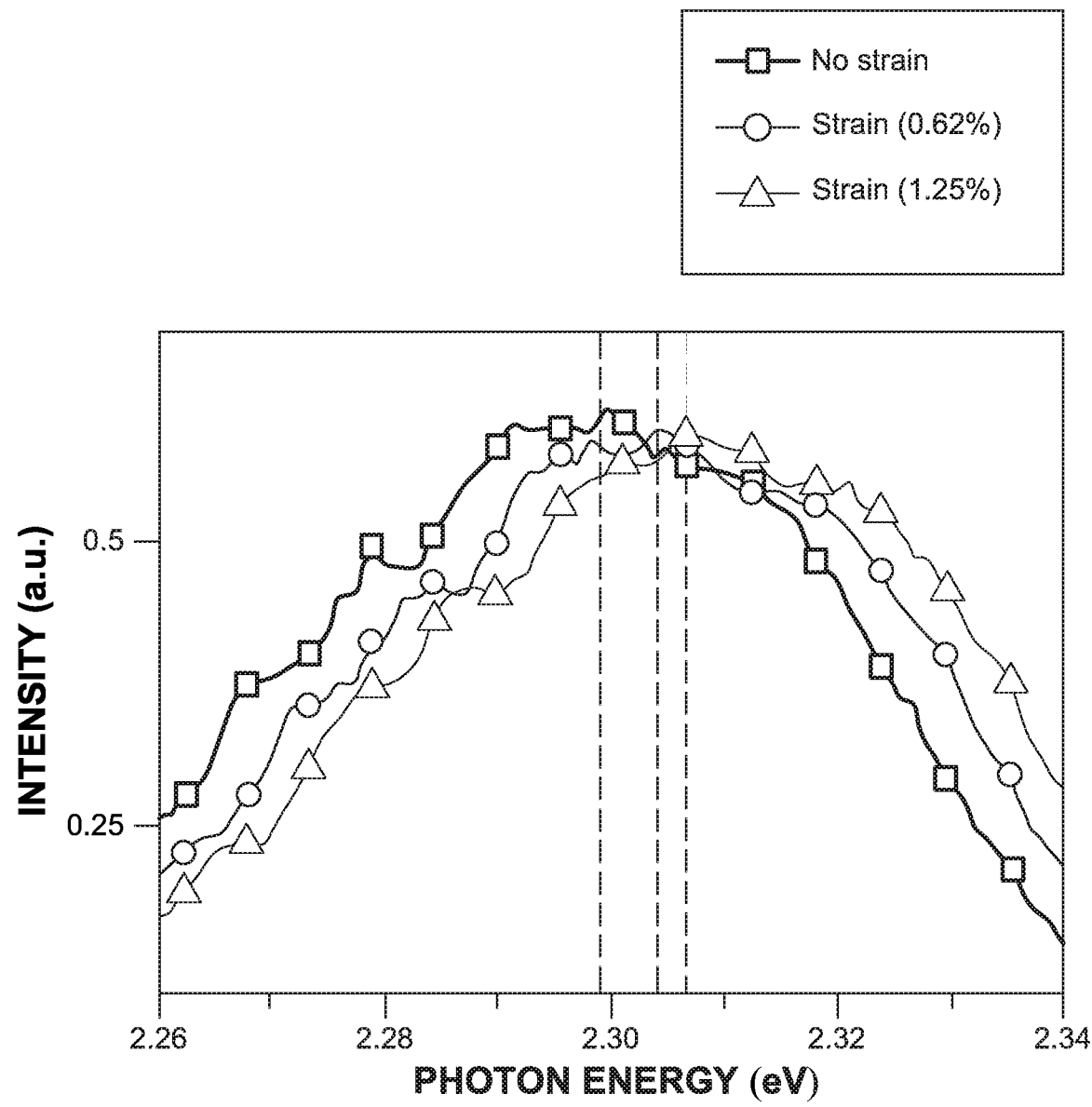
FIG. 6C shows the blue shift of the $MAPbBr_3$ material under various degrees of mechanical strain.

To gain insight into the mechanism leading to this blue shift, the PL spectra of the MAPbBr$_3$ sample was measured under varying mechanical strain (using the same sample setup shown in FIG. 5A) when illuminated with an excitation laser intensity of 7.7 W cm$^{-2}$ (see FIG. 6C). When the strain was increased, the PL emission blue-shifted and increased in intensity, which is the same trend observed in the excitation power-dependent PL experiments shown in FIGS. 6A and 6B. Comparing the sample's PL spectral blue shift (20 meV) with increasing laser intensity from 7.7 to 60 W cm$^{-2}$ (see FIG. 5B) with the blue shift (8 meV) of the sample under 1.25% mechanical strain (see FIG. 6C), it is noted that the change in peak position observed in the excitation power-dependent PL must be at least partially derived from the photostrictive effect. Because most of the contribution of the change in the band gap comes from the distortion of the Br 4p and Pb 6p orbitals, the compressive strain of the MAPbBr$_3$ crystal due to the photostriction leads to the tilting distortion of the PbBr$_6$ octahedral structure, which affects the size of the band gap.

The other contribution to the blue shift of the PL in the power-dependent measurements might be attributed to the Burstein-Moss effect, in which the Fermi level is pushed to the conduction band due to electron filling. This hypothesis is consistent with the fact that the observed PL peak continues to blue shift for an excitation power of 100 W cm$^{-2}$, unlike the Raman spectra, which had already saturated at this laser intensity (see FIG. 3B).

Figure 7:
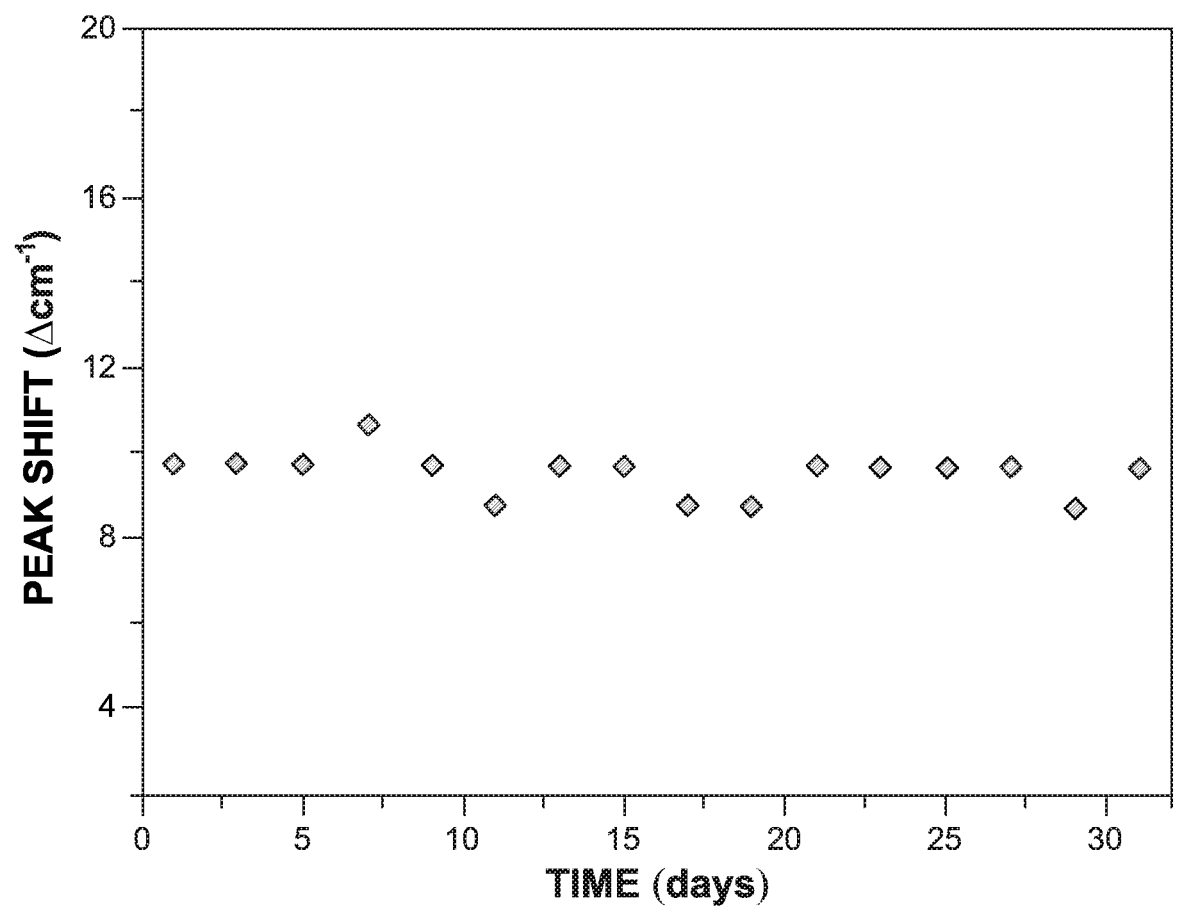
FIG. 7 shows the shift in the MAPbBr$_3$ material's Raman peak position under laser illumination at an intensity of 100 W cm$^{-2}$ as a function of time.

Having shown that the $MAPbBr_3$ crystal indeed exhibits the photostrictive phenomena, next it is discussed its long-term stability, because, as discussed earlier, a photostrictive material needs to show good long-term stability for being able to be implemented into commercial products. Therefore, the photostriction of an $MAPbBr_3$ crystal sample was measured over 30 d to determine how the Raman spectrum changed over time. During this long-term stability test, the $MAPbBr_3$ crystal sample was stored within an opaque petri dish without encapsulation, and it was placed inside an electronic moisture-proof box filled with air at room temperature. FIG. 7 shows the shift in the sample's Raman peak position under laser illumination at an intensity of 100 W $cm^{-2}$ as a function of time. It is observed a slight decay in the peak shift (from 10.64 to 9.64 $cm^{-1}$) at the beginning of the experiment, which it is believed to be due to the surface hydration of the crystal. However, after this initial slight decay, there was no significant change in the peak position for 30 d, indicating the excellent optical stability of $MAPbBr_3$ material.

The long-term stability of this perovskite has been attributed to its compact structure. The small ionic radius of $Br^-$ in the $MAPbBr_3$ material (1.96 Å for $Br^-$), the strong Pb—Br bond (201 kJ $mol^{-1}$), and its short length (3.05 Å) leads to a closely packed cubic crystal structure, which also decreases interactions with external molecules (e.g., moisture). In contrast to the $MAPbBr_3$ material, the Pb—I bond in the $MAPbI_3$ material is weaker and longer (bond energy of 142 kJ $mol^{-1}$ and average bond length of 3.21 Å), which may be why the $MAPbI_3$ material is more chemically unstable and easily decomposes in air.

In addition, the halogen-(amine) hydrogen bonds (i.e., the H—Br bond) in the $MAPbBr_3$ material are stronger than the H—I bond in the $MAPbI_3$ material due to the higher electronegativity of Br, which also further contributes to the relative stability of the $MAPbBr_3$ material. As a result, previous studies have repeatedly observed that the $MAPbBr_3$ material is moisture-insensitive and displays long-term stability, maintaining its crystal structure in ambient atmosphere with a high relative humidity for at least five months. Encapsulation of this material should only further improve the material's stability to make it a more viable option for commercial applications.

Under polarized light, a built-in electric field (originating from the local polarization of the $MAPbBr_3$ material) will separate photo-generated electrons and holes in the direction of the local polarization (i.e., the photovoltaic effect). Note that the local polarization may arise from ionic off-centering and the rotation of the atomic $PbBr_6$ cage. This polarization can aid the separation of photoexcited electron-hole pairs and reduce charge carrier recombination, which also changes the magnitude of the generated electric field. The relationship between the polarization and deformation of the material can be described by the free energy expansion analysis. The electric field generated by the photovoltaic effect can then cause the dipolar MA cations to align in the direction of the polarization (i.e., MA cation reorientation). The reorientation motions of the MA cation can then induce a large amplitude of structural motions and lattice distortions via strong coupling of translation-rotation and acoustic phonons in the $MAPbBr_3$ material. The strong anharmonicity of atomic displacements induced by this translation-rotation coupling can then lead to large lattice compression in $MAPbBr_3$ material. Therefore, the strong coupling of the MA molecular cations and the inorganic framework in $MAPbBr_3$ material has the potential to generate a large photostriction effect.

This was observed in the power-dependent Raman results shown in FIG. 3A, in which the photostrictive effect increased with the excitation intensity as more carriers were photogenerated, thus increasing the electric field. Similarly, the saturation of the photostriction effect after the laser intensity exceeded 60 W $cm^{-2}$ (i.e., the saturation of the Raman peak blue shift) can be attributed to the saturation of the photoinduced field when the internal electric field is fully canceled out by the free-carriers due to electrostatic screening. To understand these screening effects, the carrier density was estimated at which point the saturation of the photostriction occurs. Based on this collective evidence, the mechanism of photostriction in the $MAPbBr_3$ material can be understood as a combination of the photovoltaic effect and translational symmetry loss of the perovskite's local molecular configuration caused by the strong translation-rotation coupling.

Although the effect of polarization in the $MAPbBr_3$ material has been demonstrated with theoretical studies, there has been no experimental evidence in this regard to date. Therefore, the inventors have used a piezoresponse force microscopy (PFM) to examine the polarization in the $MAPbBr_3$ thin films. The results showed that most out-of-plane polarization pointed toward the bottom of the sample when the $MAPbBr_3$ thin film was scanned, with a conducting tip featuring an alternating current voltage of 3 V. This observation confirms the presence of down polarization domains in the $MAPbBr_3$ material with the application of an external electric field, which supports the hypothesis of light-induced polarization and reorientation of the MA cations, resulting in photostriction of the crystal.

The above experiments and analysis reveal the photostrictive effect of the organic-inorganic hybrid perovskite $MAPbBr_3$ material using in situ Raman spectroscopy by monitoring shifts in the A2 optical phonon mode. The large Raman blue shift of this mode indicates the $MAPbBr_3$ material changing its physical dimensions due to compressive strain produced by the illumination of the crystal. By comparing the Raman blue shift under photoexcitation and mechanical compression, a potential deformation equation was derived to estimate the maximum photostriction of $MAPbBr_3$ material to be as high as 1.25% under visible-light illumination at room temperature. The variation in the material's crystalline lattice can be attributed to a combination of the photovoltaic effect and translational symmetry loss of the molecular configuration, which is a result of the strong translation-rotation coupling in the $MAPbBr_3$ material.

Figure 8:
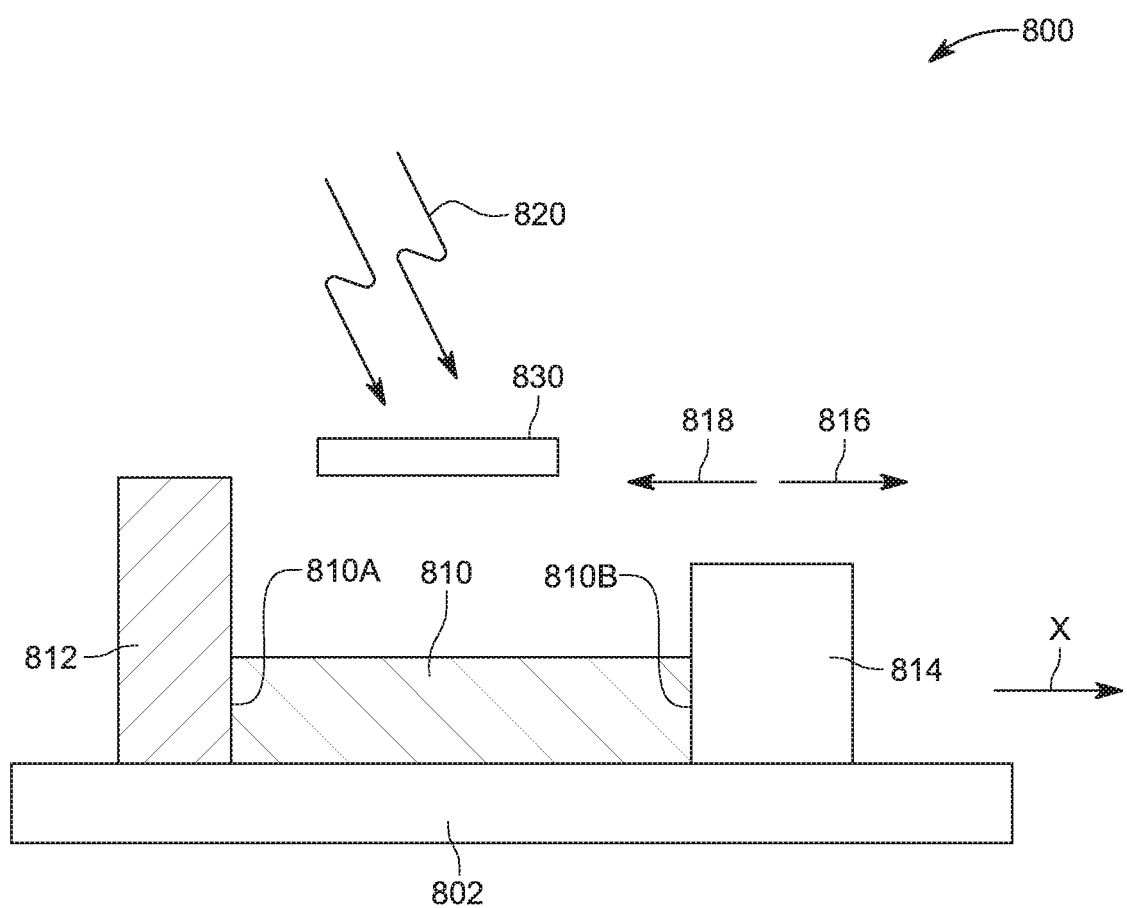
FIG. 8 illustrates the MAPbBr$_3$ material integrated into an energy converting device.

Morever, the $MAPbBr_3$ perovskite displays outstanding stability (>30 d) due to its strong and short Pb—Br bonds, which in combination with its excellent photostrictive properties suggests promising applications in a variety of opto-mechanical systems. These applications are now discussed in more detail. The photostrictive property of the $MAPbBr_3$ material can be implemented, for example, in a light-modulated, perovskite-based, energy converting device 800, as illustrated in FIG. 8. The energy converting device 800 may have a substrate 802 on which the $MAPbBr_3$ material 810 is placed. At one end 810A, the $MAPbBr_3$ material 810 is in contact with a base 812. Base 812 is fixedly attached to the substrate 802 so that the base cannot move relative to the substrate. However, the $MAPbBr_3$ material 802 is not attached to the substrate 810, so that its other end 810B can move relative to the substrate 802 and also relative to the base 812, along a longitudinal direction X. The first end 810A of the MAPbBr$_3$ material 810 can be fixedly attached to the base 812 (e.g., glued) or loosely attached (i.e., just in contact). In one application, the first end 810A may be fixedly attached to the substrate 802 and thus, the base 812 may be omitted.

An actuator block 814 is fixedly attached to the second end 810B of the MAPbBr$_3$ material 810. The actuator block 814 is free to move along the longitudinal direction X, along the substrate 802. In one application, the material of the actuator block is selected to be as light as possible (to minimize friction with the substrate) and/or to have a smallest possible coefficient of friction.

When light 820 is allowed to fall onto the MAPbBr$_3$ material 810, as discussed above, the MAPbBr$_3$ material expands or contracts, i.e., its dimensions are changing, either decreasing or increasing. This means that the MAPbBr$_3$ material 810 extends along the longitudinal axis X, which pushes the actuator block 814 along the positive direction 816 of the axis X. When the incident light 820 is suppressed, the MAPbBr$_3$ material 810 contracts and assumes its original size. This means that the actuator block 814 is now retrieved along the negative direction 818 of the axis X. This back and forth movement of the actuator block 814 can be used in various applications.

Note that the energy converting device 800 is transforming, in this embodiment, electromagnetic energy (light) into mechanical energy (movement of the actuator block). Thus, the energy converting device may be used as motor, or a switch, or any other device that uses mechanical energy. To act as a motor, the energy converting device 800 needs to intermittently receive the light 820, i.e., during on and off periods, so that both extension and constriction of the MAPbBr$_3$ material 810 is achieved. This can be achieved, for example, with a light modulating device 830, for example, a shutter mechanism, that can be programmed to open and closed with a desired frequency.

Figure 9:
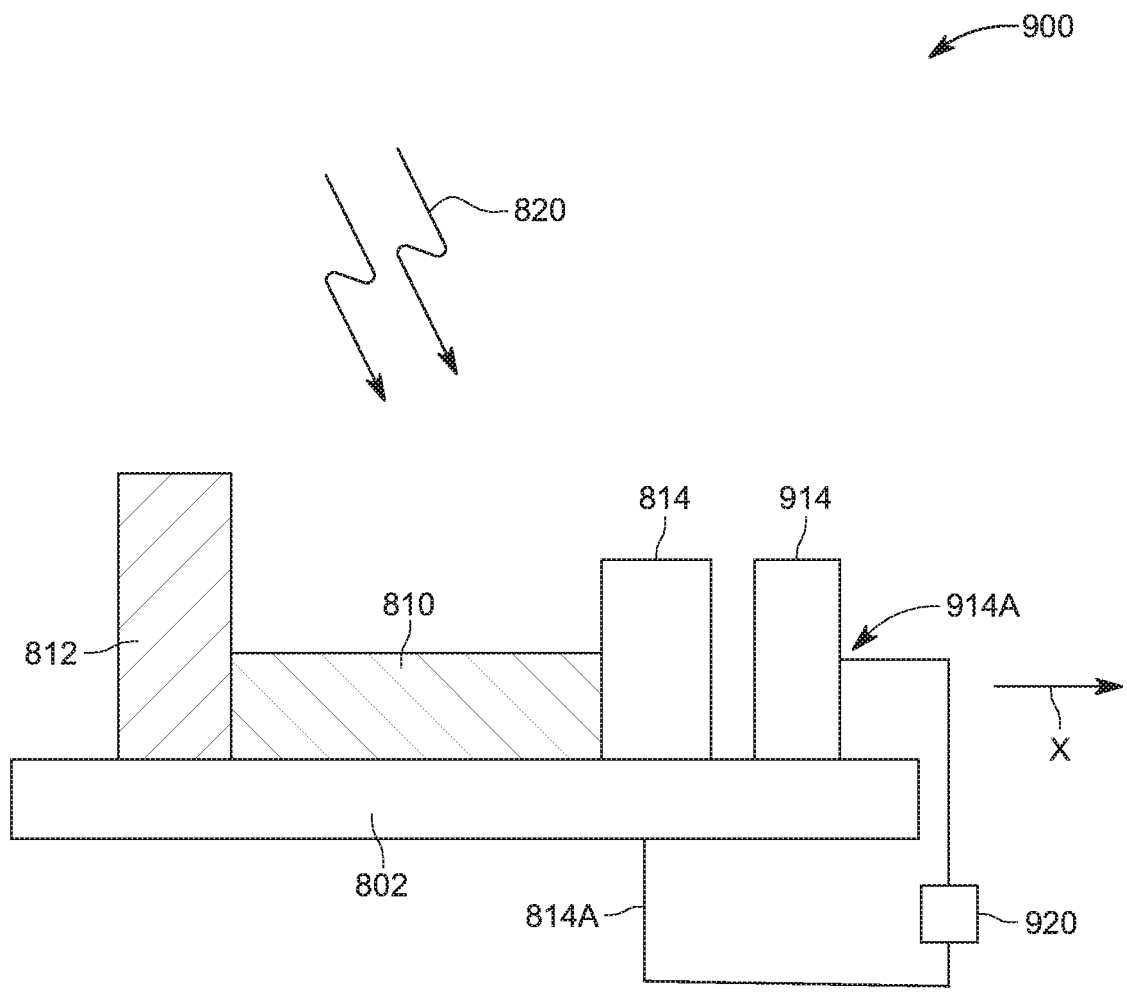
FIG. 9 illustrates the MAPbBr$_3$ material integrated into a wireless switch.

In another application, as illustrated in FIG. 9, the MAPbBr$_3$ material may be implemented in a remotely controlled switch device 900. The switch device 900 may have a configuration similar to the energy converting device 800, except for an electrical contact 914, which is placed next to the actuator block 814, as illustrated in the figure. Each of the electrical contact 914 and the actuator block 814 may be made of a conductive material, and each one is connected to a corresponding wire 914A and 814A. in one application, the wire 814A is electrically connected to the MAPbBr$_3$ material 810, which is an electrical conductor. The electrical wires 814A and 914A form an open electrical circuit with an electrical device 920. When light 820 is shun onto the MAPbBr$_3$ material 810, the photostrictive effect changes length of the material, which moves the actuator block 814, so that the gap G formed between the actuator block 814 and the electrical contact 914 vanishes. In this way, the electrical circuit formed by the wires 814A and 914A and the electrical device 920 is closed, and the electrical device 920 is powered up or actuated.

Because the light 820 is sent by a user or another device (not shown) from a given distance, the switch device 900 is remotely controlled. Note that the electrical device 920 can be any device, i.e., a computer, transceiver, base station in a telecommunication network, etc.

Figure 10:
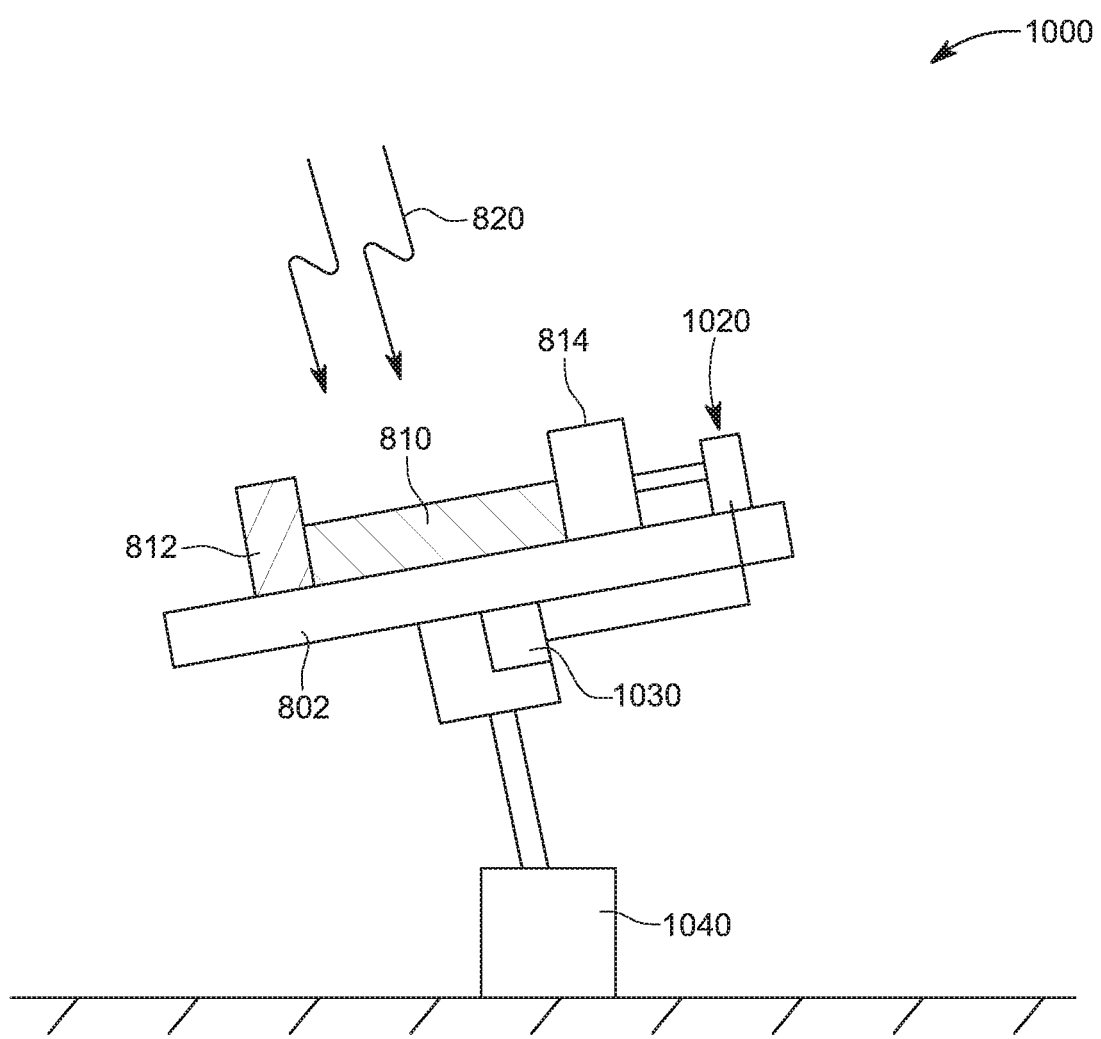
FIG. 10 illustrates the MAPbBr$_3$ material integrated into a sun chaser device.

In still another embodiment, as illustrated in FIG. 10, a sun following device 1000 may be manufactured based on the MAPbBr$_3$ material 810. The MAPbBr$_3$ material 810 is placed on the substrate 802 as in the embodiment of FIG. 8. A base 812 is fixedly attached to the substrate and an actuator block 814 is fixedly attached to an end of the MAPbBr$_3$ material 810. However, the actuator block 814 is free to move relative to the substrate 802. The amount of movement of the actuator block 814 is measured in this embodiment with a displacement sensor 1020. Thus, a motion of the actuator block 814 is measured with the displacement sensor and fed to a controller 1030. In one embodiment, the displacement sensor 1020 can measure directly a movement of the end of the material 810, in which case the presence of the actuator block 814 is not necessary. The device 1000 is calibrated to record the maximum displacement of the actuator block 814, due to the photostrictive effect of the MAPbBr$_3$ material 810. For example, for each hour of the day, it is possible to collect the amount of expansion of the MAPbBr$_3$ material 810, for a given location. The same data can be collected for various seasons.

Then, when in use, the substrate 802 would have a certain orientation in space. For that orientation, the light 820 will illuminate the MAPbBr$_3$ material 810 and generate a certain expansion, which is translated in a certain movement of the actuator block 814. This movement is recorded by the displacement sensor 1020 and provided to the controller 1030. The controller then compares the measured displacement with the maximum displacement of the actuator block for a given time of the day and day of the year. If the recorded displacement is smaller than the maximum value for that time of the day, the controller 1030 instructs one or more motors 1040 to align the substrate 802 to the incoming light 820 to increase the light exposure of the MAPbBr$_3$ material 810. This process can continue until the newly measured displacement of the actuator block is in a certain range relative to the maximum calibrated value. In this way, the substrate 802 can be continuously aligned during the day, with the light source (e.g., the sun), to have the incoming light 820 as perpendicular as possible to the substrate, i.e., to maximize the extension of the MAPbBr$_3$ material 810. This sun following device may be used to align solar panels (e.g., the substrate 802 may be a solar panel) with the sun light during the day, or for aligning other devices with a light source.

Figure 11:
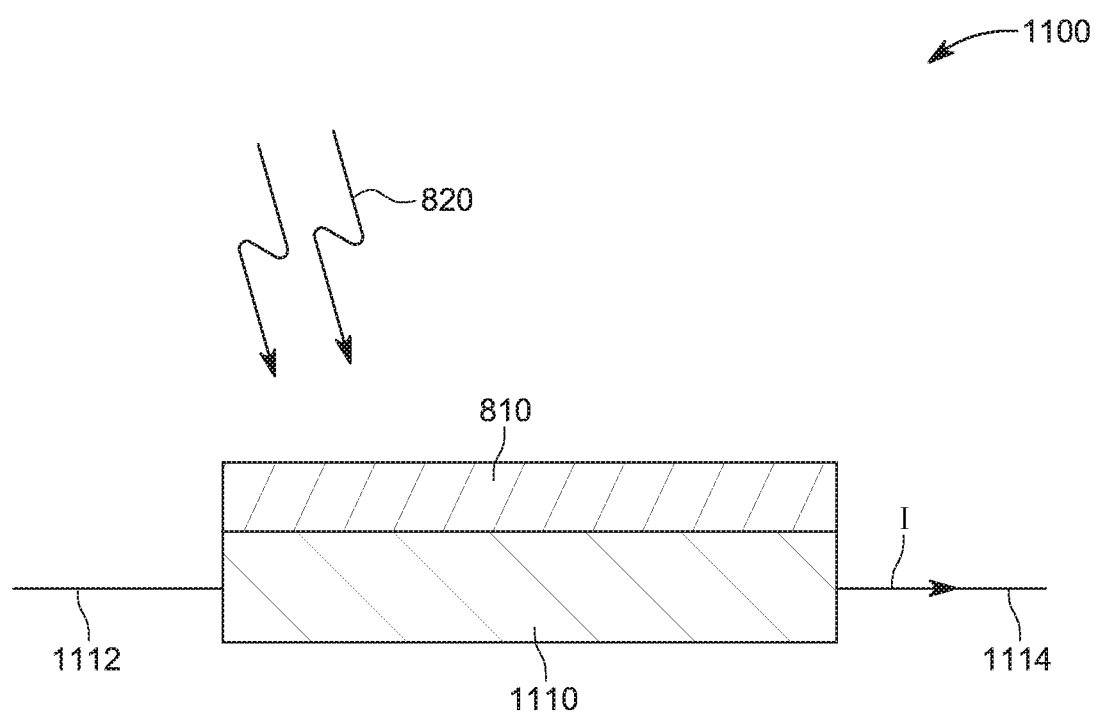
FIG. 11 illustrates the MAPbBr$_3$ material integrated into an energy converting device that transforms optical energy into electrical energy.
Figure 12:
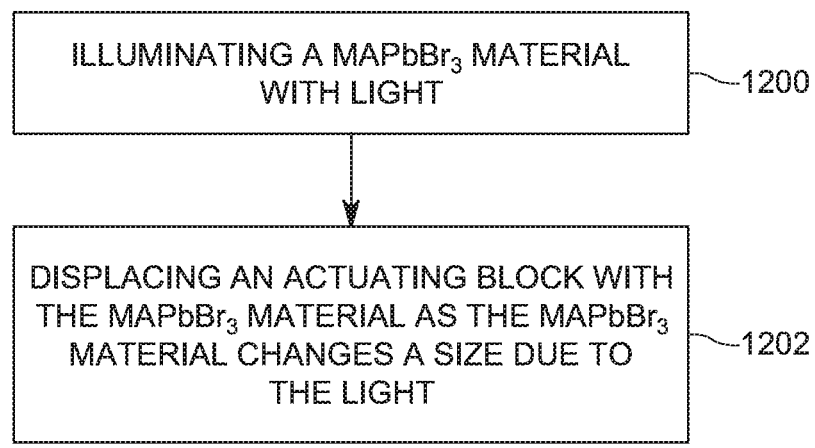
FIG. 12 is a flowchart of a method for transforming optical energy, with the MAPbBr$_3$ material, into another type of energy.

In still another embodiment, as illustrated in FIG. 11, an energy harvesting device 1100 is implemented based on the MAPbBr$_3$ material 810. The MAPbBr$_3$ material 810 is placed in contact with a piezoelectric material 1110, which is connected to two electrical wires 1112 and 1114. When light 820 is shun onto the MAPbBr$_3$ material 810, it changes its size due to the photostrictive effect. However, because the MAPbBr$_3$ material 810 is attached to the piezoelectric material 1110, this material is also changing its size, together with the MAPbBr$_3$ material 810. Because of its piezoelectric properties, the piezoelectric material 1110 transforms this mechanical energy into an electrical current I, which is harvested by wires 1112 and 1114. Thus, the energy harvesting device 1100 transforms the electromagnetic energy of the incoming light 820 into electrical current I. In one embodiment, the energy harvesting device 1100 may be made on the substrate 802, shown in FIG. 8, and to have the base 812 and the actuator block 814. In one application, base 812 and the actuator block 814 may be omitted while the substrate 802 may be retained.

Many other possible implementations of the MAPbBr$_3$ material discussed herein may be imagined by those skilled in the art. For example, in optics, a fast and large photostriction can be used to achieve all-optical control in optical logic elements. For example, a photostrictive transistor can control a light flow in a similar fashion as a transistor controls an electric current flow. Also, it is possible to substitute the electro-optical components with photostrictive devices.

Another possible application is the control of the magnetization direction in low dimensional magnetic materials, which is desired for magnetic recording. This is conventionally performed by applying external magnetic fields. In spintronics, for example, the magnetic field can be generated by passing large currents to micro strips generally made of gold. However, these currents generate heating effects that become increasingly important as dimensions are reduced below a micrometer, making this approach challenging for high-density magnetic memories. Use of the photostriction effect in the $MAPbBr_3$ material, in combination with a magnetic overlayer having inverse magnetostriction effect, can constitute an alternative and wireless approach to the traditional way.

According to an embodiment, a method for converting light energy into a different energy with the $MAPbBr_3$ material described above is now discussed.

The method includes a step 1200 of illuminating the $MAPbBr_3$ material 810 with light 820, and a step 1202 of displacing an actuating block 814 with the $MAPbBr_3$ material 810 as the $MAPbBr_3$ material 810 changes a size due to the light. The light received by the $MAPbBr_3$ material is transformed into another form of energy, for example, mechanical energy, as in the embodiment shown in FIG. 8, or electrical energy as the embodiment illustrated in FIG. 11.

The disclosed embodiments described a novel property, the photostrictive effect, of the $MAPbBr_3$ material, and integrate this new property into an energy converting device. The embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] Y. Zhou, L. You, S. Wang, Z. Ku, H. Fan, D. Schmidt, A. Rusydi, L. Chang, L. Wang, P. Ren, L. Chen, G. Yuan, L. Chen, J. Wang, Nat. Commun. 2016, 7, 11193.
[2] X. Zheng, B. Chen, M. Yang, C. Wu, B. Orler, R. B. Moore, K. Zhu, S. Priya, ACS Energy Lett. 2016, 1, 424.
[3] M. Benavides-Garcia, K. Balasubramanian, J. Chem. Phys. 1994, 100, 2821.
[4] B. Li, Y. Li, C. Zheng, D. Gao, W. Huang, RSC Adv. 2016, 6, 38079.

What is claimed is:

1. An energy converting device comprising:
a base which is fixed;
a methylammonium lead bromide ($MAPbBr_3$) material extending from the base, along a longitudinal direction and having a first end fixedly attached to the base and a second end free to move along the longitudinal direction; and
an actuator block fixedly attached to the second end of the $MAPbBr_3$ material,
wherein the actuator block moves relative to the base along the longitudinal direction when the $MAPbBr_3$ material is exposed to light.

2. The energy converting device of claim 1, wherein the $MAPbBr_3$ material changes a length under light exposure.

3. The energy converting device of claim 2, wherein the $MAPbBr_3$ material increases the length under light exposure.

4. The energy converting device of claim 1, further comprising:
a substrate to which the base is fixedly attached, wherein the second end of the $MAPbBr_3$ material and the actuator block are free to move relative to the substrate.

5. The energy converting device of claim 4, further comprising:
an electrical contact forming a gap with the actuator block.

6. The energy converting device of claim 5, wherein the actuator block touches the electrical contact when the $MAPbBr_3$ material is exposed to light, so that an electrical circuit is closed.

7. The energy converting device of claim 6, wherein the $MAPbBr_3$ material acts as a remote controlled switch.

8. The energy converting device of claim 1, further comprising:
a light modulating device that controls an amount of light that reaches the $MAPbBr_3$ material.

9. The energy converting device of claim 1, further comprising:
a displacement sensor configured to measure a displacement of the actuator block; and
a controller configured to receive the displacement of the actuator block and to adjust a position of the $MAPbBr_3$ material to follow a direction of the light.

10. The energy converting device of claim 1, further comprising:
a piezoelectric material attached to the $MAPbBr_3$ material so that a light received by the $MAPbBr_3$ material is transformed into an electrical current by the piezoelectric material.

11. An energy converting device comprising:
a substrate;
a base attached to the substrate;
a methylammonium lead bromide ($MAPbBr_3$) material located on the substrate and having a first end fixedly attached to the base and a second end free to move relative to the substrate and the base; and
an actuator block located on the substrate and free to move relative to the substrate,
wherein the second end of the $MAPbBr_3$ material moves the actuator block relative to the first end when the $MAPbBr_3$ material is exposed to light, thus converting light energy to mechanical energy.

12. The energy converting device of claim 11, wherein the $MAPbBr_3$ material changes a length, between the first and second ends, under light exposure.

13. The energy converting device of claim 11, wherein the MAPbBr$_3$ material increases a length, between the first and second ends, under light exposure.

14. The energy converting device of claim 11, further comprising:
   an electrical contact forming a gap with the actuator block.

15. The energy converting device of claim 14, wherein the actuator block touches the electrical contact when the MAPbBr$_3$ material is exposed to the light, so that an electrical circuit is closed.

16. The energy converting device of claim 11, further comprising:
   a light modulating device that controls an amount of light that reaches the MAPbBr$_3$ material.

17. An energy converting device comprising:
   a methylammonium lead bromide (MAPbBr$_3$) material extending along a longitudinal direction;
   a piezoelectric material extending along the longitudinal direction and directly attached to the MAPbBr$_3$ material along the longitudinal direction; and
   two electrical wires connected to different ends of the piezoelectric material to collect an electrical current,
   wherein a light received by the MAPbBr$_3$ material is transformed into the electrical current by the piezoelectric material.

* * * * *